(12) United States Patent
Ohmi et al.

(10) Patent No.: US 6,975,018 B2
(45) Date of Patent: Dec. 13, 2005

(54) SEMICONDUCTOR DEVICE

(75) Inventors: Tadahiro Ohmi, 1-17-301, Komegafukuro 2-Chome, Aoba-Ku, Sendai-Shi, Miyagi 980-0813 (JP); Shigetoshi Sugawa, Sendai (JP); Masaki Hirayama, Sendai (JP); Yasuyukil Shirai, Sendai (JP)

(73) Assignee: Tadahiro Ohmi, (JP)

( * ) Notice: Subject to any disclaimer, the term of this patent is extended or adjusted under 35 U.S.C. 154(b) by 59 days.

(21) Appl. No.: 10/452,000

(22) PCT Filed: Dec. 27, 2001

(86) PCT No.: PCT/JP01/11597

§ 371 (c)(1),
(2), (4) Date: Dec. 8, 2003

(87) PCT Pub. No.: WO02/054473

PCT Pub. Date: Jul. 11, 2002

(65) Prior Publication Data

US 2004/0102052 A1    May 27, 2004

(30) Foreign Application Priority Data

Dec. 28, 2000  (JP)  ............................. 2000-402834
Mar. 28, 2001  (JP)  ............................. 2001-094245

(51) Int. Cl.$^7$ ............................................. H01L 23/58
(52) U.S. Cl. ................... 257/629; 257/499; 257/392; 257/393; 257/394
(58) Field of Search .................... 257/392–394, 257/499, 613, 629

(56) References Cited

U.S. PATENT DOCUMENTS 5,576,229 A  *  11/1996  Murata et al. ............... 438/162
6,017,784 A      1/2000  Ohta et al.

FOREIGN PATENT DOCUMENTS

JP    06-120152    4/1994
JP    08-213404    8/1996

OTHER PUBLICATIONS

Kassabov J et al., "Plasma Processing Effects on 02-HC1 Grown Sl-Si02 Structures", Solid-State Electronics UK. vol. 32. No. 7, Jul. 1982, pp. 535-540.
Suyama S et al., "Low-Temperature Formation of Gate-S102 Films for Poly-SI TFTS by 02-AR Sputtering", Electronics & Communications in Japan, Part II—Electronics, Scripta Technica, New York, US, vol. 76, No. 9, Sep. 1993, pp. 91-98.

* cited by examiner

Primary Examiner—Dung A. Le
(74) Attorney, Agent, or Firm—Finnegan, Henderson, Farabow, Garrett & Dunner, L.L.P.

(57) ABSTRACT

In a fabrication method of a semiconductor device including a plurality of silicon-based transistors or capacitors, there exist hydrogen at least in a part of a silicon surface in advance, and the hydrogen is removed by exposing the silicon surface to a first inert gas plasma. Thereafter, plasma is generated by a mixed gas of a second inert gas and one or more gaseous molecules, and a silicon compound layer containing at least a part of the elements constituting the gaseous molecules is formed on the surface of the silicon gas.

4 Claims, 21 Drawing Sheets

CONVENTIONAL EXAMPLE

PRESENT INVENTION

SEMICONDUCTOR DEVICE

TECHNICAL FIELD

The present invention relates to a semiconductor device in which an oxide film, a nitride film, an oxynitride film, or the like, is formed on a silicon semiconductor, and the fabrication method thereof.

BACKGROUND ART

The gate insulation film of a MIS (metal/insulator/silicon) transistor is required to have various high-performance electric properties and high reliability characteristics, such as low leakage current characteristics, low interface state density, high breakdown voltage, high resistance against hot carriers, and uniform threshold voltage characteristics.

The thermal oxidation technology using oxygen molecules or water molecules at approximately 800° C. or more has been used conventionally as the formation technology of the gate insulation film that satisfies the above requirements.

A thermal oxidation process has been conducted conventionally after conducting a cleaning process of removing surface contaminants, such as organic materials, metals, and particles, as a preprocessing process. In such a conventional cleaning process, cleaning using a diluted hydrofluoric acid or hydrogenated water, for example, is performed at last, for terminating the dangling bonds existing on the silicon surface by hydrogen. Thereby, formation of a native oxide film on the silicon surface is suppressed, and the silicon substrate thus having a clean surface is forwarded to the following thermal oxidation process. In the thermal oxidation process, the terminated hydrogen at the surface undergoes decoupling during the process of raising the temperature of the silicon substrate in an inert gas atmosphere of argon (Ar), for example at a temperature equal to or more than 600° C., approximately. Then, oxidization of the silicon surface is conducted at approximately 800° C. or more in an atmosphere to which oxygen molecules or water molecules are introduced.

Conventionally, in a case where a silicon oxide film is formed on the silicon surface by using such a thermal oxidization technique, satisfactory oxide film/silicon interface characteristics, high breakdown voltage of the oxide film, leakage current characteristics, and the like, are achieved only in the case where a silicon surface having the (100) orientation is used. Further, remarkable degradation of leak current occurs in the case where the thickness of the silicon oxide film formed by the conventional thermal oxidation process is reduced to approximately 2 nm or less. Thus, it has been difficult to realize a high-performance miniaturized transistor that requires decrease of the gate insulation film thickness.

Further, in a crystal silicon having a surface orientation other than the (100) orientation or a polycrystalline silicon generally having a primarily (111)-oriented surface on an insulation film, interface state density at the oxide film/silicon interface is remarkably high as compared with the silicon oxide film formed on the (100)-oriented silicon even when the silicon oxide film is formed by using the thermal oxidation technology. Thus, a silicon oxide film having a reduced film thickness possesses poor electric properties in terms of breakdown characteristics, leakage current characteristics, and the like. Hence, there has been a need of increasing the film thickness of the silicon oxide film when using such a silicon oxide film.

Meanwhile, the use of large-diameter silicon wafer substrate or large-area glass substrate is increasing these days for improving the efficiency of semiconductor device production. In order to form transistors on the entire surface of such a large-size substrate with uniform characteristics and with high throughput, an insulation film forming process conducted at a low temperature so as to decrease the magnitude of the temperature change in heating or cooling and, further, having small temperature dependence is required. In the conventional thermal oxidation process, there has been a large fluctuation of oxidation reaction rate with respect to temperature fluctuation, and it has been difficult to produce semiconductor devices with high throughput while using a large-area substrate.

In order to solve these problems associated with the conventional thermal oxidation technology, multitudes of low-temperature film formation processes have been attempted. Among others, the technology disclosed in Japanese Laid-Open Patent Publication No. 11-279773 or the technology disclosed in Technical Digest of International Electron Devices Meeting, 1999, pp. 249–252, or in 2000 Symposium on VLSI Technology Digest of Technical Papers, pp. 76–177, describes a process in which an inert gas is introduced into plasma together with gaseous oxygen molecules, thereby effectively causing the inert gas having a large metastable level to conduct the atomization of the oxygen molecules. Hence, relatively good electronic properties are achieved.

In these technologies, a microwave is irradiated to the mixed gas formed of krypton (Kr) that is an inert gas and an oxygen ($O_2$) gas, the mixed plasma of Kr and $O_2$ is generated, and a large amount of atomic state oxygen O* are formed. Then, the oxidation of silicon is conducted at a temperature of about 400° C., and low leakage current characteristics, low interface state density, and high breakdown voltage comparable to those of the conventional thermal oxidation are achieved. Further, according to this oxidation technology, a high-quality oxide film is obtained also on the silicon surface having a surface orientation other than the (100) surface.

However, in such a conventional silicon oxide film formation technology using the microwave-excited plasma, in spite of the fact that the oxidation is conducted by using atomic state oxygen O*, only a silicon oxide film having electric properties comparable to those obtained by the conventional thermal oxidation process that uses oxygen molecules or water molecules is obtained. Particularly, it has been impossible to obtain the good low leakage current characteristics in the silicon oxide film having a thickness of approximately 2 nm or less on the silicon substrate surface. Thus, it has been difficult to realize high-performance, miniaturized transistors that require further decrease of the gate insulation film thickness, similarly to the case of conventional thermal oxide film formation technology.

Further, there has been a problem that degradation of conductance caused by hot carrier injection into the oxide film of a transistor, or degradation of electric properties with time such as increase of leakage current, in a device that causes tunneling of electrons through the silicon oxide film as in the case of a flash memory, occur more noticeably than in the case where the silicon oxide film is formed by the conventional thermal processes.

DISCLOSURE OF THE INVENTION

Accordingly, a general object of the present invention is to provide a novel and useful semiconductor device and a fabrication method thereof in which the problems described above are eliminated.

A more specific object of the present invention is to provide a low-temperature plasma oxidation technology as an alternative to the conventional thermal oxidation technology.

Another object of the present invention is to provide high-quality insulation film formation technology at low temperatures that can be applied to silicon surfaces of every orientation.

Still another object of the present invention is to provide reliable, high performance, and miniaturized semiconductor devices using such high-quality insulation film formation technology at low temperatures, particularly, transistor integrated circuit device, flash memory devices, and three dimensional integrated circuit devices provided with a plurality of transistors or various function elements, and to provide a fabrication method thereof.

A further object of the present invention is to provide a semiconductor device comprising a silicon compound layer formed on a silicon surface, wherein the silicon compound layer contains at least a predetermined inert gas and has a hydrogen content of $10^{11}/cm^2$ or less in terms of surface density.

Another object of the present invention is to provide a semiconductor memory device comprising, on a common substrate, a transistor including a polysilicon film formed on a silicon surface via a first silicon compound layer, and a capacitor including a second silicon compound layer formed on a polysilicon surface, wherein each of the first and second silicon compound layers contains at least a predetermined inert gas and has a hydrogen content of $10^{11}/cm^2$ or less in terms of surface density.

Another object of the present invention is to provide a semiconductor device having a polysilicon layer or amorphous silicon layer formed on a substrate as an active layer, wherein a silicon compound layer containing at least a predetermined inert gas and having a hydrogen content of $10^{11}/cm^2$ or less in terms of surface density is formed on a surface of the silicon layer, and the semiconductor device drives a display device formed on the substrate.

Another object of the present invention is to provide a fabrication method of a semiconductor device on a silicon surface, including the steps of:

exposing the silicon surface to a first plasma of a first inert gas so as to remove hydrogen existing on at least a part of the silicon surface in advance; and generating a second plasma of a mixed gas of a second inert gas and one or a plurality of kinds of gaseous molecules, and forming, on the silicon surface, a silicon compound layer containing at least a part of elements constituting the gaseous molecules under the second plasma.

Another object of the present invention is to provide a fabrication method of a semiconductor memory device having, on a common substrate, a transistor including a polysilicon film formed on a silicon surface via a first insulation film and a capacitor including a second insulation film formed on a polysilicon surface, including the steps of:

exposing the silicon surface to a first plasma of a first inert gas so as to remove hydrogen existing on at least a part of the silicon surface in advance; and generating a second plasma of a mixed gas of a second inert gas and one or a plurality of kinds of gaseous molecules, and forming, on the silicon surface, a silicon compound layer containing at least a part of elements constituting the gaseous molecules as the first insulation film under the second plasma.

Another object of the present invention to provide a fabrication method of a semiconductor device having a polysilicon layer or amorphous silicon layer on a substrate as an active layer, including the steps of:

forming, on said substrate, a silicon layer formed by said polysilicon layer or amorphous layer;

exposing a surface of said silicon layer to a plasma of a first inert gas so as to remove hydrogen existing on at least a part of said surface of said silicon layer; and generating a plasma of a mixed gas of a second inert gas and one or a plurality of kinds of gaseous molecules and forming, on said surface of said silicon layer, a silicon compound layer including at least a part of elements constituting said gaseous molecules.

According to the present invention, it becomes possible to completely remove surface-terminating hydrogen even at low temperature of about 400° C. or less in continuous processing without breaking vacuum and without degrading the planarity of a silicon surface. Hence, it is possible to form a silicon oxide film, silicon nitride film, and silicon oxynitride film, having characteristics and reliability superior to those of a silicon oxide film formed by a conventional thermal oxidation process or microwave plasma processing, on a silicon of any surface orientation at low temperature of about 500° C. or less. Consequently, it becomes possible to realize a miniaturized transistor integrated circuit having high reliability and high performance.

Also, according to the present invention, it becomes possible to form a thin and high-quality silicon oxide film, silicon nitride film, and silicon oxynitride film having good characteristics such as leakage current and breakdown voltage even on a silicon surface of a corner part of a device isolation sidewall of, for example, a shallow-trench isolation or on a silicon surface having a surface form with projections and depressions. Consequently, it becomes possible to achieve high-density device integration with a narrowed device isolation width and high-density device integration having a three-dimensional structure.

In addition, by using the gate insulation film of the present invention, it was possible to realize a flash memory device and the like capable of significantly increasing the number of times of rewriting.

Further, according to the present invention, it becomes possible to form a high-quality silicon gate oxide film and silicon gate nitride film even on a polysilicon formed on an insulation film and having a predominantly (111)-oriented surface. As a result, it becomes possible to realize a display apparatus that uses a polysilicon transistor having high driving ability, and further, a three-dimensional integrated circuit device in which a plurality of transistors or functional devices are stacked.

BEST MODE FOR CARRYING OUT THE INVENTION

Hereinafter, various preferable embodiments in which the present invention is applied will be explained in detail with reference to the drawings.

(First Embodiment)

First, a description will be given of an oxide film formation at low temperatures by using plasma.

Figure 1:
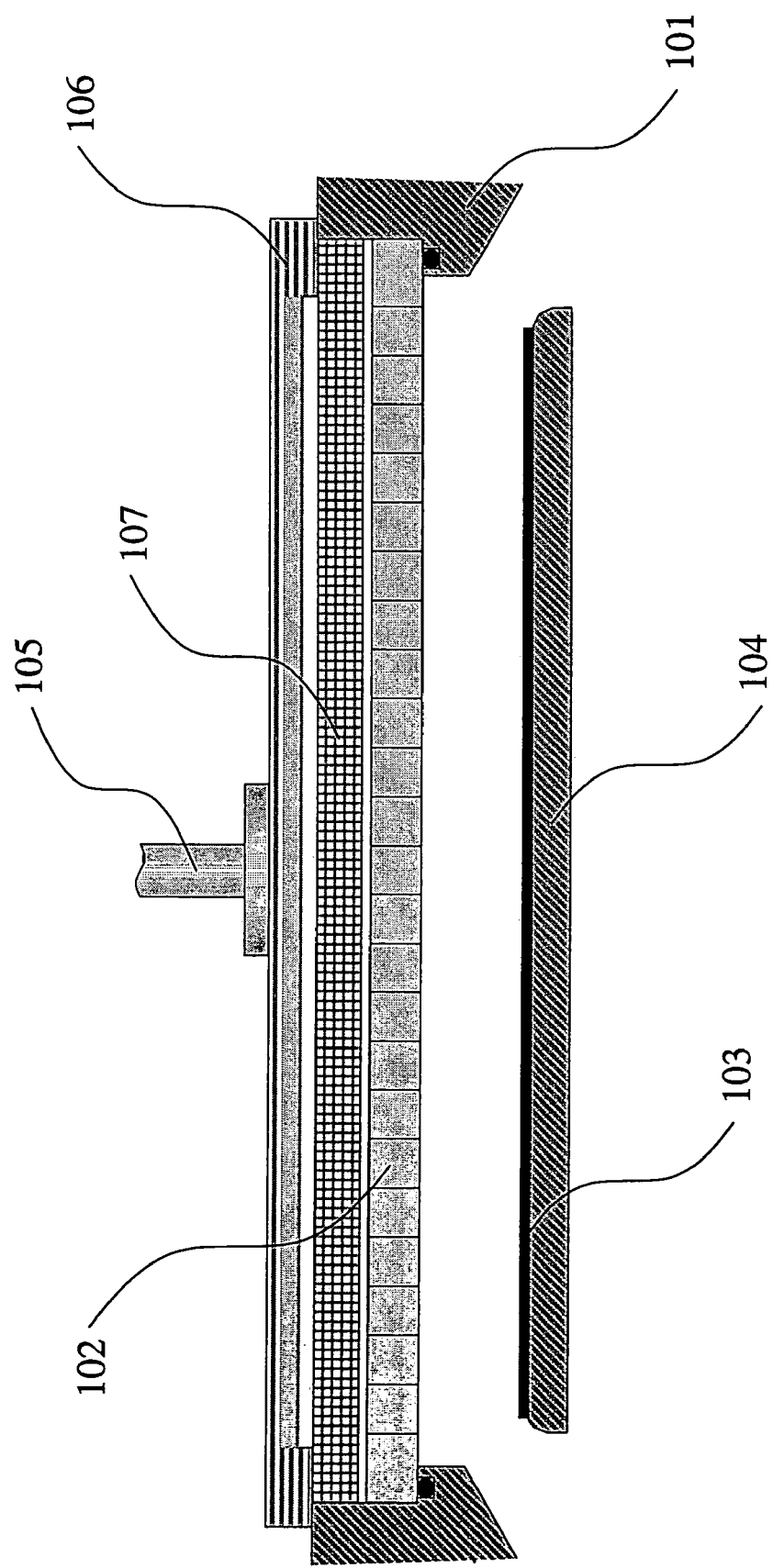
FIG. 1 is a conceptual diagram of a plasma apparatus that uses a radial line slot antenna.

FIG. 1 is a cross-sectional view showing an example of a plasma processing apparatus used in the present invention and using a radial line slot antenna.

In this embodiment, in order to remove the hydrogen terminating the dangling bonds at a silicon surface, Kr, which is used as the plasma excitation gas in the subsequent oxide film formation process, is used, and the removal process of the surface-terminating hydrogen and the oxidation process are conducted in the same processing chamber continuously.

First, a vacuum vessel (processing chamber) 101 is evacuated and an Ar gas is introduced first from a shower plate 102. Then, the gas is changed to the Kr gas. Further, the pressure inside the processing chamber 101 is set to about 13.3 Pa (1 Torr).

Next, a silicon substrate 103 is placed on a stage 104 having a heating mechanism, and the temperature of a specimen is set to about 400° C. As long as the temperature of the silicon substrate 103 is in the range of 200–500° C., almost the same results explained as below are obtained. It should be noted that the silicon substrate 103 is cleaned by a diluted hydrofluoric acid in the preprocessing step immediately before and, as a result, the silicon dangling bonds on the surface are terminated by hydrogen.

Next, a microwave having the frequency of 2.45 GHz is supplied to a radial line slot antenna 106 from a coaxial waveguide 105, wherein the microwave is introduced into the processing chamber 101 from the radial line slot antenna 106 through a dielectric plate 107 provided on a part of the wall of the processing chamber 101. The introduced microwave causes excitation of the Kr gas that is introduced into the processing chamber 101 from the shower plate 102 and, consequently, there is induced high-density Kr plasma right underneath the shower plate 102. As long as the frequency of the microwave to be supplied is in the range of about 900 MHz or more but not exceeding about 100 GHz, almost the same results explained as below are obtained.

In the construction of FIG. 1, the interval between the shower plate 102 and the substrate 103 is set to 6 cm in this embodiment. The narrower the interval, the faster the film formation becomes. This embodiment shows the example of film formation by using the plasma apparatus that uses the radial line slot antenna, however, it should be noted that the plasma may be induced by introducing the microwave into the processing chamber by other methods.

By exposing the silicon substrate 103 to the plasma thus excited by the Kr gas, the surface of the silicon substrate 103 is subjected to irradiation of low energy Kr ions, and the surface-terminating hydrogen are removed.

Figure 2:
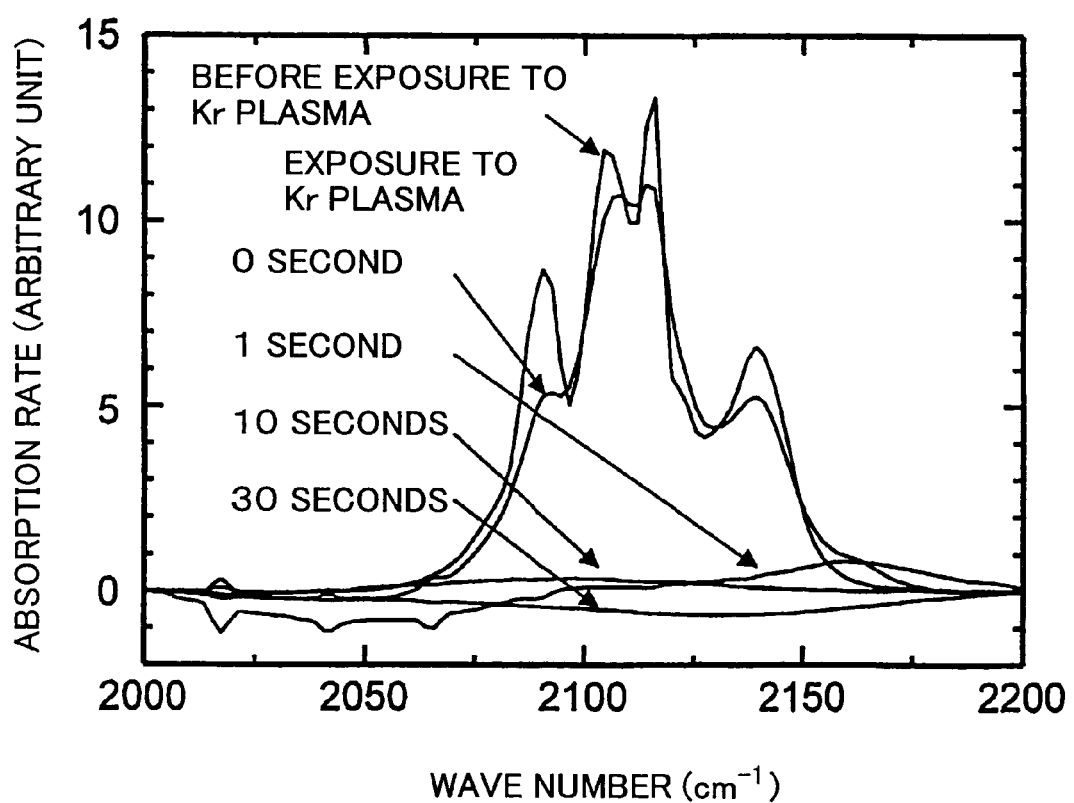
FIG. 2 is a characteristic diagram showing the dependence of the bond formed between the surface-terminating hydrogen at a silicon surface and silicon on the exposure to Kr plasma as measured by an infrared spectroscopy.

FIG. 2 shows the result of analysis of the silicon-hydrogen bond on the surface of the silicon substrate 103 by means of infrared spectrometer and shows the effect of removal of the surface-terminating hydrogen at the silicon surface by the Kr plasma induced by introducing the microwave into the processing chamber 101 under the pressure of 13.3 Pa (1 Torr) with the power of 1.2 W/cm$^2$.

Referring to FIG. 2, it can be seen that the optical absorption at about 2100 cm$^-$, which is characteristic to the silicon-hydrogen bond, is more or less vanished after the Kr plasma irradiation conducted for only about 1 second, and is almost completely vanished after irradiation for approximately thirty seconds. That is, the surface-terminating hydrogen on the silicon surface can be removed by the Kr plasma irradiation conducted for approximately 30 seconds. In this embodiment, the surface-terminating hydrogen is completely removed by conducting the Kr plasma irradiation for 1 minute.

Next, a Kr/O$_2$ mixed gas is introduced from the shower plate 102 with a partial pressure ratio of 97/3. On this occasion, the pressure of the processing chamber is maintained at about 13.3 Pa (1 Torr). In the high-density excitation plasma in which the Kr gas and the O$_2$ gas are mixed, Kr* in the intermediate excitation state and the O$_2$ molecules cause collision, and it is possible to efficiently form atomic state oxygen O* in large amount.

In this embodiment, with the atomic state oxygen O* thus formed, the surface of the silicon substrate 103 is oxidized. In the conventional thermal oxidation methods conducted on a silicon surface, the oxidation is caused by $O_2$ molecules or $H_2O$ molecules and a very high processing temperature of 800° C. or more has been needed. In the oxidation processing of the present invention conducted by the atomic state oxygen, the oxidation is possible at a very low temperature of about 400° C. In order to facilitate the collision of Kr* and $O_2$, it is preferable that the processing chamber pressure be high. However, under excessively high pressure, the O* thus formed collide mutually and return to $O_2$ molecules. Obviously, there exists an optimum gas pressure.

Figure 3:
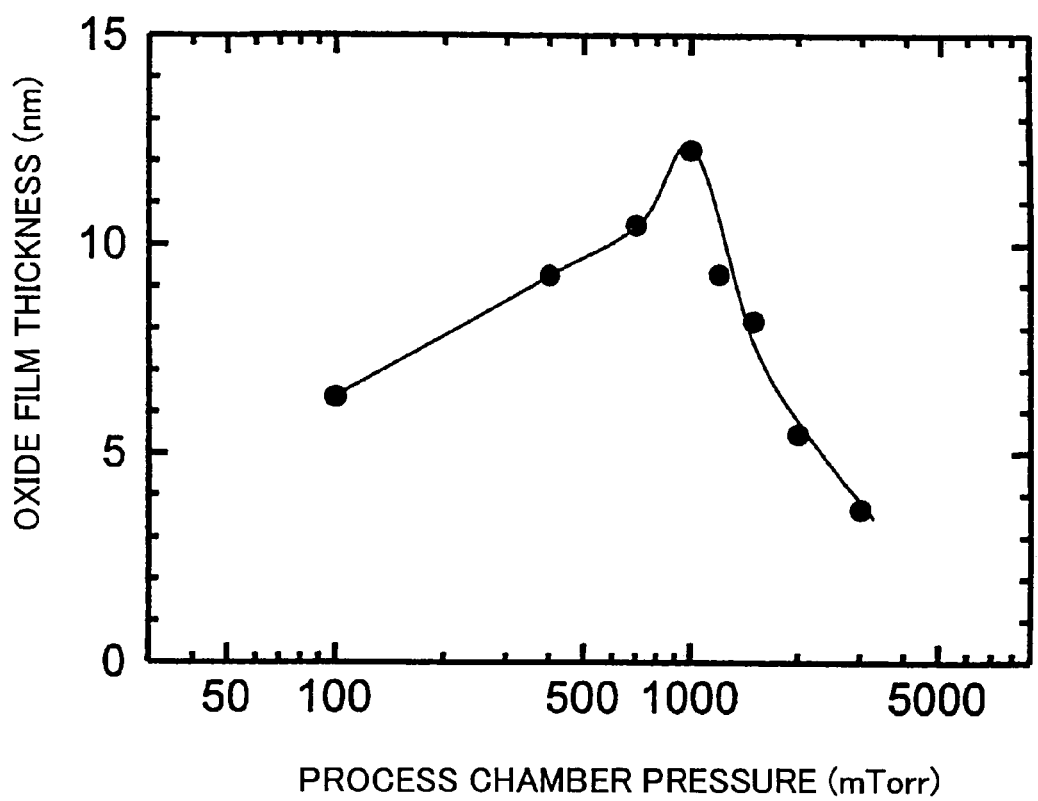
FIG. 3 is a characteristic diagram showing the dependence of silicon oxide film thickness on the gas pressure of the processing chamber.

FIG. 3 shows the relationship between the thicknesses of the oxide film formed and the internal pressure of the processing chamber of the case where the gas pressure inside the processing chamber 101 is changed while maintaining the $Kr/O_2$ pressure ratio inside the processing chamber to 97/3. In FIG. 3, the temperature of the silicon substrate 103 is set to 400° C. and 10 minutes oxidation processing is conducted.

Referring to FIG. 3, it can be seen that the oxidation rate becomes maximum when the pressure inside the processing chamber 101 is approximately 13.3 Pa (1 Torr) and that this pressure or the pressure condition near this is optimum. This optimum pressure is not limited to the case where the silicon substrate 103 has the (100) surface orientation but is the same also in other cases where the silicon surface has any other surface orientations.

After the silicon oxide film of the desired film thickness is formed, the introduction of the microwave power is shutdown and the plasma excitation is terminated. Further, the $Kr/O_2$ mixed gas is replaced with the Ar gas, and the oxidation processing is terminated. It should be noted that the use of the Ar gas before and after this step is intended to use a gas cheaper than Kr for the purging gas. The Kr gas used in the this step is recovered and reused.

Following the above oxide film formation, a semiconductor integrated circuit device including transistors and capacitors is completed after conducting electrode formation processing, passivation film formation processing, hydrogen sintering processing, and the like.

The result of measurement of hydrogen content in the silicon oxide film formed according to the foregoing processing indicates that the hydrogen content is about $10^{12}/cm^2$ or less in terms of surface density in the case where the silicon oxide film has a thickness of 3 nm, wherein it should be noted that the foregoing measurement was conducted by measuring the hydrogen release caused with temperature rise. Particularly, it was confirmed that the oxide film characterized by a small leakage current shows that the hydrogen content in the silicon oxide film is about $10^{11}/cm^2$ or less in terms of surface density. On the other hand, the oxide film not exposed to the Kr plasma before the oxide film formation contained hydrogen with the surface density exceeding $10^{12}/cm^2$.

Further, the comparison was made between the roughness of the silicon surface after the oxide film formed according to the foregoing processing was removed and the roughness of the silicon surface before the oxide film formation wherein the measurement of the surface roughness was made by using an atomic force microscope. It was confirmed that there is caused no change of surface roughness. That is, there is caused no roughening of silicon surface even when the oxidation processing is conducted after the removal of the surface-terminating hydrogen.

Figure 4:
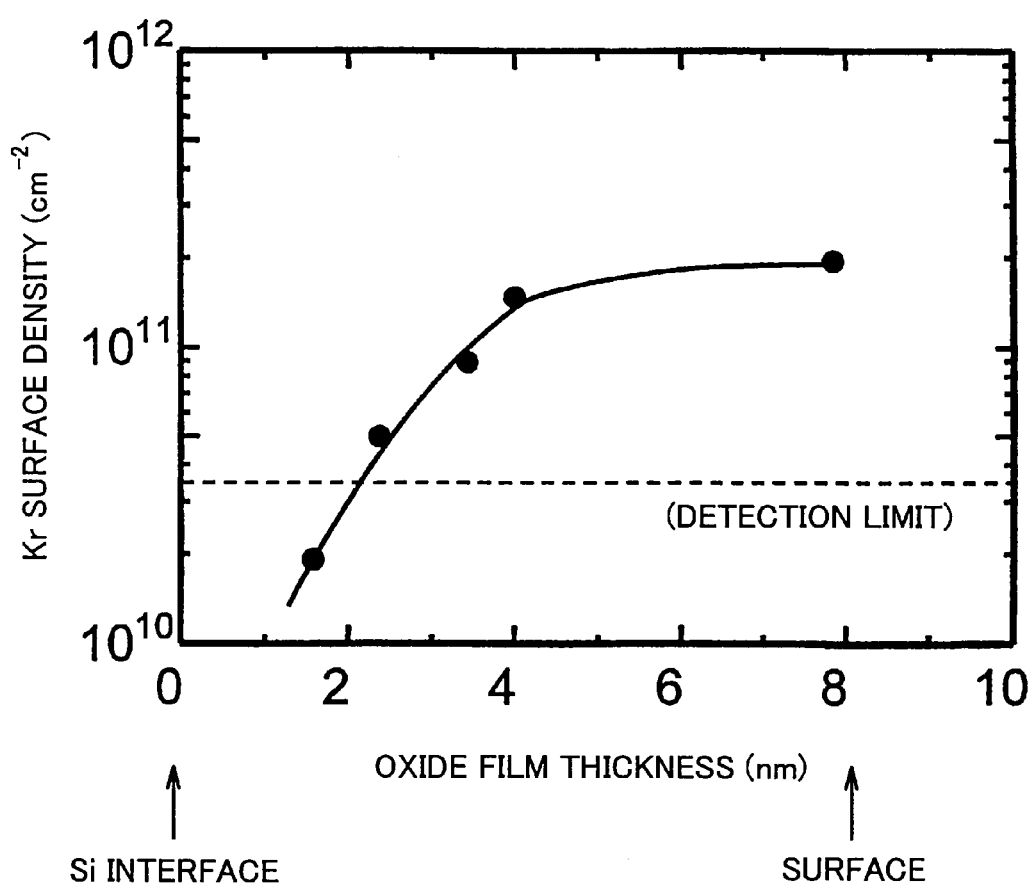
FIG. 4 is a characteristic diagram showing the depth distribution profile of the Kr density in the silicon oxide film.

FIG. 4 shows the depth profile of Kr density in the silicon oxide film formed according to the foregoing processing as measured by the total reflection X-ray fluorescent spectrometer. It should be noted that FIG. 4 shows the result for the silicon (100) surface, however, this result is not limited to the (100) surface and a similar result is obtained also in other surface orientations.

In the experiment of FIG. 4, the partial pressure of oxygen in Kr is set to 3% and the pressure of the processing chamber is set to 13.3 Pa (133 Torr). Further, the plasma oxidation processing is conducted at the substrate temperature of 400° C.

Referring to FIG. 4, the Kr density in the silicon oxide film increases with increasing distance from the underlying silicon surface and reaches the value of about $2\times10^{11}/cm^2$ at the surface of the silicon oxide film. This indicates that the silicon oxide film obtained according to the foregoing processing is a film in which the Kr concentration is constant in the film in the region where the distance to the underlying silicon surface is 4 nm or more and in which the Kr concentration decreases toward the silicon/silicon oxide interface in the region within the distance of 4 nm from the silicon surface.

Figure 5:
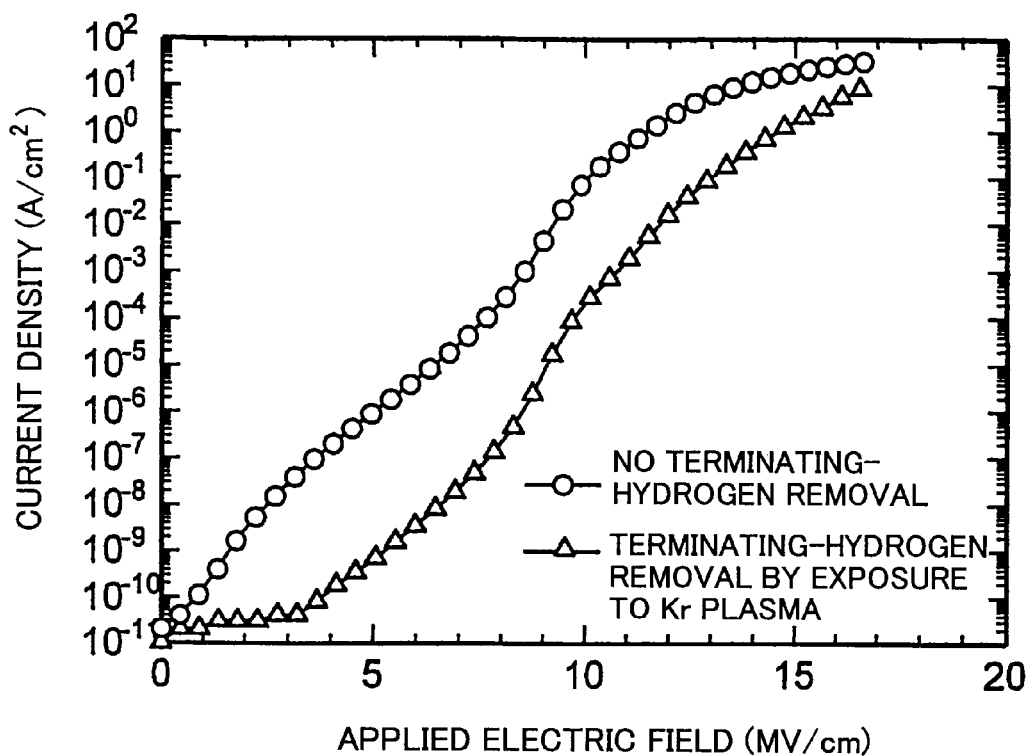
FIG. 5 is a characteristic diagram showing the current versus voltage characteristic of the silicon oxide film.

FIG. 5 shows the dependence of the leakage current on the applied electric field for the silicon oxide film obtained according to the foregoing process. It should be noted that the result of FIG. 5 is for the case where the thickness of the silicon oxide film is 4.4 nm. For the purpose of comparison, FIG. 5 also shows the leakage current characteristic of the oxide film of the same thickness in the case where no exposure to the Kr plasma was conducted before the formation of the oxide film.

Referring to FIG. 5, the leakage current characteristic of the silicon oxide film not exposed to the Kr plasma is equivalent to the leakage current characteristic of the conventional thermal oxide film. This means that the $Kr/O_2$ microwave plasma oxidation processing does not improve the leakage current characteristics of the oxide film thus obtained very much. On the other hand, in the oxide film formed according to this embodiment where the oxidation processing is conducted by introducing the $Kr/O_2$ gas after removing the terminated hydrogen by the Kr plasma irradiation, it can be seen that the leakage current is improved by the order of 2 or 3 as compared with the leakage current of the silicon oxide film formed by the conventional microwave plasma oxidation processing when measured at the same electric field, indicating that the silicon oxide film formed by this embodiment has excellent low leakage characteristics. It is further confirmed that a similar improvement of leakage current characteristic is achieved also in the silicon oxide film having a much thinner film thickness of up to about 1.7 nm.

Figure 6:
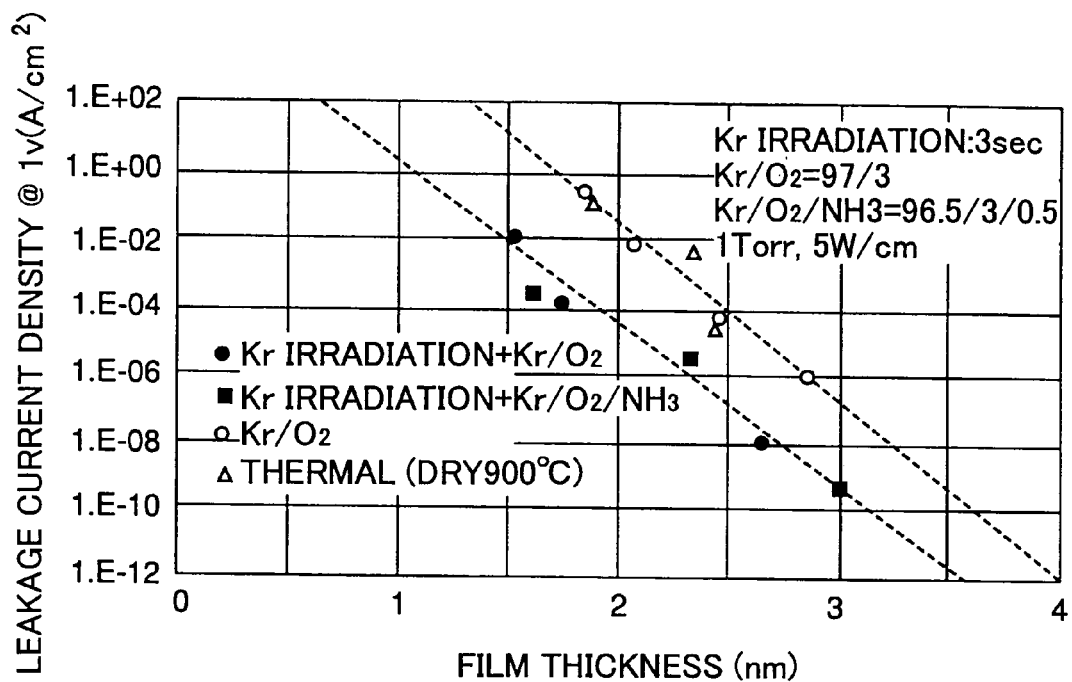
FIG. 6 is a diagram showing the relationship between the leakage current characteristics of the silicon oxide film and the silicon oxynitride film, and the film thickness.

FIG. 6 shows the result of measurement of the leakage current characteristics of the silicon oxide film of this embodiment for the case where the thickness of the silicon oxide film is varied. In FIG. 6, Δ shows the leakage current characteristic of a conventional thermal oxide film, ○ shows the leakage current characteristic of the silicon oxide film formed by conducting the oxidation by the $Kr/O_2$ plasma while omitting the exposure process to the Kr plasma, and ● shows the leakage current characteristic of the silicon oxide film of this embodiment in which the oxidation is conducted by the $Kr/O_2$ plasma after exposure to the Kr plasma. In FIG. 6, it should be noted that the data represented by ■ show the leakage current characteristic of an oxynitride film to be explained later.

Referring to FIG. 6, it can be seen that the leakage current characteristic of the silicon oxide film represented by ○ and formed by the plasma oxidation processing while omitting the exposure process to the Kr plasma coincides with the leakage current characteristic of the thermal oxide film represented by Δ, while it can be seen also that the leakage current characteristics of the silicon oxide film of this embodiment and represented by ● is reduced with respect to the leakage current characteristics represented by ○ by the order of 2–3. Further, it can be seen that a leakage current of $1 \times 10^{-2}$ A/cm$^2$, which is comparable to the leakage current of the thermal oxide film having the thickness of 2 nm, is achieved in the silicon oxide film of this embodiment even when the thickness thereof is approximately 1.5 nm.

Further, the measurement of the surface orientation dependence conducted on the silicon/silicon oxide interface state density for the silicon oxide film obtained by this embodiment has revealed the fact that a very low interface state density of approximately $1 \times 10^{10}$ cm$^{-2}$eV$^{-1}$ is obtained for any silicon surface of any surface orientation.

Further, the oxide film formed by this embodiment shows equivalent or superior characteristics as compared with the conventional thermal oxide film with regard to electric and reliability characteristics, such as breakdown voltage characteristics, hot carrier resistance, electric charges QBD (Charge-to-Breakdown) up to the failure of the silicon oxide film when a stress current is applied.

As described above, it is possible to form a silicon oxide film on a silicon of any surface orientation even at a low temperature of 400° C. by conducting the silicon oxidation processing by the Kr/O$_2$ high-density plasma after removal of the surface-terminating hydrogen. It is thought that such an effect is achieved because of the reduced hydrogen content in the oxide film caused as a result of the removal of the terminating hydrogen and because of the fact that the oxide film contains Kr. Because of the reduced amount of hydrogen in the oxide film, it is believed that weak element bonding is reduced in the silicon oxide film. Further, because of the incorporation of Kr in the film, the stress inside the film and particularly at the Si/SiO$_2$ interface is relaxed, and there is caused a reduction of electric charges in the film or interface state density. Consequently, the electric properties of the silicon oxide film is significantly improved.

Particularly, it is believed that reducing the hydrogen concentration to the level of $10^{12}$/cm$^2$ or less, preferably to the level of $10^{11}$cm$^2$ or less, and incorporation of Kr with a concentration of about $5 \times 10^{11}$/cm$^2$ or less in terms of the surface concentration are thought to contribute to the improvement of electric properties and reliability characteristics of the silicon oxide film.

In order to realize the oxide film of the present invention, in addition to the apparatus of FIG. 1, it is also possible to use a plasma processing apparatus capable of conducting the oxide film formation at low temperatures by using plasma. For example, it is also possible to use a two-stage shower plate-type plasma processing apparatus that is provided with a first gas release structure releasing the Kr gas for plasma excitation by a microwave and a second gas release structure that is different from the first gas release structure and releases the oxygen gas.

In this embodiment, it should be noted that the oxidation processing is terminated such that the feeding of the microwave power is shutdown and plasma excitation is finished upon formation of the silicon oxide film to a desired film thickness, followed by the process of replacing the Kr/O$_2$ mixed gas with the Ar gas. However, it is also possible to introduce a Kr/NH$_3$ mixed gas from the shower plate 102 with the partial pressure ratio of 98/2 before shutting down the microwave power while maintaining the pressure at about 13.3 Pa (1 Torr), and terminate the processing when a silicon nitride film of approximately 0.7 nm is formed on the surface of the silicon oxide film. According to such a method, a silicon oxynitride film in which a silicon nitride film is formed on the surface thereof is obtained, and thus it becomes possible to form an insulation film having a higher specific dielectric constant.

(Second Embodiment)

Next, a description will be given of nitride film formation at low temperatures by using plasma. An apparatus similar to that shown in FIG. 1 is used for the nitride film formation.

In this embodiment, it is preferable to use Ar or Kr for the plasma excitation gas for removing the terminating hydrogen and for the nitride film formation, in order to form a high-quality nitride film.

Hereinafter, an example of using Ar will be represented.

First, the interior of the vacuum vessel (processing chamber) 101 is evacuated to vacuum and an Ar gas is introduced from the shower plate 102 such that the pressure inside the processing chamber is set to about 13.3 Pa (100 mTorr).

Next, the silicon substrate 103, subjected to hydrogenated water cleaning and the silicon dangling bonds at the surface are terminated by hydrogen in the preprocessing step immediately before, is introduced into the processing chamber 101 and is placed on the stage 104 having the heating mechanism. Further, the temperature of the specimen is set to 500° C. As long as the temperature is in the range of 300–550° C., results almost the same as the one described below are obtained.

Next, a microwave of 2.45 GHz is supplied into the processing chamber from the coaxial waveguide 105 via the radial line slot antenna 106 and the dielectric plate 107 and a high-density plasma of Ar is generated in the processing chamber. As long as the frequency of the supplied microwave is in the range of about 900 MHz or more but not exceeding about 10 GHz, results almost the same as the one described below are obtained. The interval between the shower plate 102 and the substrate 103 is set to 6 cm in this embodiment. With decreasing interval, faster deposition rate becomes possible. While this embodiment shows the example of film formation by a plasma apparatus that uses the radial line slot antenna, it is also possible to introduce the microwave into the processing chamber by other methods.

The silicon surface thus exposed to the plasma excited based on an Ar gas is subjected to bombardment of low energy Ar ions, and the surface-terminating hydrogen are removed. In this embodiment, the Ar plasma exposure is conducted for 1 minute.

Next, an NH$_3$ gas is introduced and mixed to the Ar gas from the shower plate 102 with a partial pressure ratio of 2%. On this occasion, the pressure of the processing chamber is held at about 13.3 Pa (100 mTorr). In excited high-density plasma in which the Ar gas and the NH$_3$ gas are mixed, there are caused collision of Ar* in the intermediate excited state and the NH$_3$ molecules, and NH* radicals are formed efficiently. The NH* radicals cause nitridation of the silicon substrate surface.

Upon formation of the silicon nitride film with a desired thickness, the introduction of the microwave power is shutdown and the excitation of the plasma is terminated. Further, the Ar/NH$_3$ mixed gas is replaced with the Ar gas and the nitridation processing is terminated.

Further, following the above nitride film formation, electrode formation processes, passivation film formation processes, hydrogen sintering processes, and the like are conducted, and a semiconductor integrated device that includes transistors and capacitors is completed.

While this embodiment showed the example in which the nitride film is formed by the plasma apparatus that uses the radial line slot antenna, it is also possible to introduce the microwave into the processing chamber by other methods. In addition, while this embodiment uses Ar for the plasma excitation gas, similar results are obtained also when Kr is used. Further, while this embodiment uses $NH_3$ for the plasma process gas, it is also possible to use a mixed gas of $N_2$ and $H_2$ for this purpose.

In the silicon nitride film formation process of the present invention, it is one of important requirements that there remains hydrogen in the plasma even after the surface-terminating hydrogen are removed. As a result of existence of hydrogen in the plasma, the dangling bonds inside the silicon nitride film as well as the dangling bond at the interface are terminated by forming Si—H bonds or N—H bond. Consequently, electron traps are eliminated from the silicon nitride film and the interface.

The existence of the Si—H bond and the N—H bond in the nitride film of the present invention is confirmed respectively by infrared absorption spectroscopy and by X-ray photoelectron spectroscopy. As a result of existence of hydrogen, the hysteresis in the CV characteristics is eliminated and the interface state density at the silicon/silicon nitride film is suppressed to $2\times10^{10} cm^{-2}$. In the case of forming the silicon nitride film by using a rare gas (Ar or Kr) and an $N_2/H_2$ mixed gas, it is possible to suppress the traps of electrons or holes in the film drastically by setting the partial pressure of the hydrogen gas to 0.5% or more.

Figure 7:
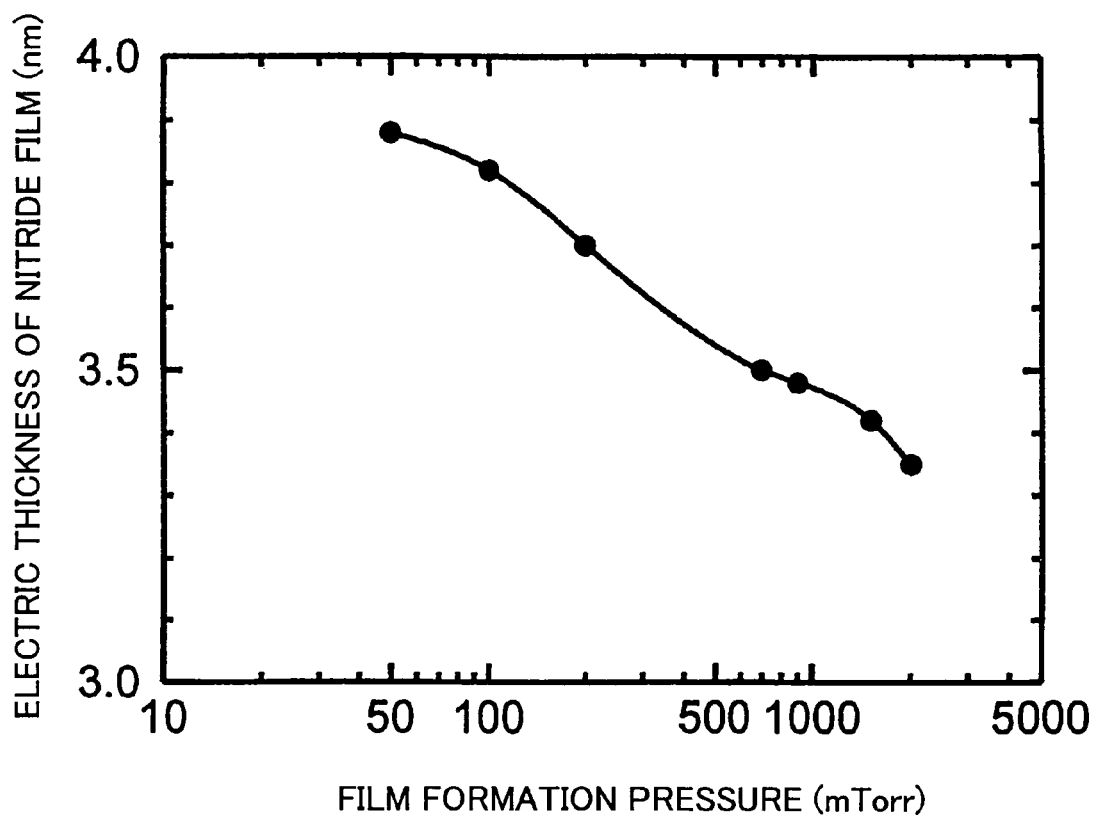
FIG. 7 is a characteristic diagram showing the dependence of the silicon nitride film thickness on the gas pressure of the processing chamber.

FIG. 7 shows the pressure dependence of the silicon nitride film thickness formed according to the process described above. In the experiment of FIG. 7, it should be noted that the $Ar/NH_3$ partial pressure ratio was set to 98/2 and the deposition time was 30 minutes.

Referring to FIG. 7, it can be seen that there occurs an increase of deposition rate of the nitride film by reducing the pressure in the processing chamber and thus by increasing the energy given to $NH_3$ (or $N_2/H_2$) by the rare gas (Ar or Kr) From the viewpoint of efficiency of nitride film formation, it is preferable that the gas pressure be in the range of 6.65–13.3 Pa (50–100 mTorr). However, from the viewpoint of productivity, it is preferable to use a unified pressure suitable to the oxidation, for example, 133 Pa (1 Torr), also for nitridation, in the process where oxidation and nitridation are continuously conducted, as will be explained in other embodiments. Additionally, it is preferable that the partial pressure of $NH_3$ (or $N_2/H_2$) in the rare gas be in the range of 1–10%, more preferably, in the range of 2–6%.

It should be noted that the silicon nitride film obtained by this embodiment showed the specific dielectric constant of 7.9, which value is about twice as large as the specific dielectric constant of a silicon oxide film.

Measurement of the current versus voltage characteristics of the silicon nitride film obtained by this embodiment has revealed the fact that a leakage current characteristic smaller by the order of 5–6 than that of a thermal oxide film having the thickness of 1.5 nm is obtained in the case where the film thickness is 3.0 nm (equivalent to the oxide film thickness of 1.5 nm), under the condition that a voltage of 1V is applied. This means that it is possible to break through the limitation of miniaturization that appears in the transistors using a silicon oxide film for the gate insulation film, by using the silicon nitride film of this embodiment.

It should be noted that the film formation condition of the nitride film described above as well as the physical and electrical properties are not limited on the (100) oriented silicon surface but are valid in the same way on the silicon of any surface orientation including the (111) surface.

It is believed that the preferable results achieved by this embodiment are not only attained by the removal of the terminating hydrogen, but also by the existence of Ar or Kr in the nitride film. In other words, in the nitride film of this embodiment, it is believed that Ar or Kr existing in the nitride film relaxes the stress inside the nitride film or at the silicon/nitride film interface, and as a result, the fixed electric charges in the silicon nitride film or the interface state density is reduced, thereby significantly improving the electric properties and the reliability characteristics.

Particularly, it is thought that the existence of Ar or Kr with the surface density of $5\times10^{11}/cm^2$ or less contributes to the improvement of the electric properties and reliability characteristics of the silicon nitride film, as in the case of the silicon oxide film.

In order to realize the nitride film of the present invention, in addition to the apparatus of FIG. 1, it is also possible to use another plasma processing apparatus capable of conducting oxide film formation at low temperatures by using plasma. For example, it is also possible to conduct film formation by using a two-stage shower plate type plasma processing apparatus that includes a first gas release structure releasing an Ar or Kr gas for excitation of plasma by microwave and a second gas release structure that is different from the first gas release structure and releases the $NH_3$ (or $N_2/H_2$) gas.

(Third Embodiment)

Next, a description will be given of an embodiment that uses, for the gate insulation film, a two-layer structure of an oxide film and nitride film formed at a low-temperature by using plasma.

The formation apparatus of the oxide film and the nitride film used in this embodiment is identical with that of FIG. 1. In this embodiment, Kr is used for the plasma excitation gas for formation of the oxide film and the nitride film.

First, the vacuum vessel (processing chamber) 101 is evacuated to vacuum and an Ar gas is introduced into the processing chamber 101 from the shower plate 102. Then, the gas to be introduced the next is switched to the Kr gas from the initial Ar gas, and the pressure of the processing chamber 101 is set to about 133 Pa (1 Torr).

Next, the silicon substrate 103, subjected to diluted hydrofluoric acid treatment and the surface dangling bonds of silicon are terminated by hydrogen in the preprocessing step immediately before, is introduced into the processing chamber 101 and placed on the stage 104 having the heating mechanism. Further, the temperature of the specimen is set to 400° C.

Next, a microwave having the frequency of 2.45 GHz is supplied to the radial line slot antenna 106 from the coaxial waveguide 105 for 1 minute, wherein the microwave is introduced into the processing chamber 101 via the dielectric plate 107. The surface-terminating hydrogen is removed by exposing the surface of the silicon substrate 103 to the high-density Kr plasma thus generated in the processing chamber 101.

Next, the pressure of the processing chamber 101 is maintained at 133 Pa (1 Torr) and a $Kr/O_2$ mixed gas is introduced from the shower plate 102 with the partial pressure ratio of 97/3. Thereby, there is formed a silicon oxide film on the surface of the silicon substrate 103 with a thickness of 1.5 nm.

Next, the supply of the microwave is shutdown momentarily and introduction of the $O_2$ gas is terminated. After purging the interior of the vacuum vessel (processing chamber) 101 with Kr, a mixed gas of $Kr/NH_3$ is introduced from the shower plate 102 with a partial pressure ratio of 98/2. Further, the microwave having the frequency of 2.56 GHz is supplied again with the pressure of the processing chamber set to about 133 Pa (1 Torr), so as to generate the high-density plasma in the processing chamber 101, thereby forming a silicon nitride film on the surface of the silicon oxide film with the thickness of 1 nm.

Upon formation of the silicon nitride film with the desired thickness, the introduction of the microwave power is stopped and the plasma excitation is terminated. Further, the $Kr/NH_3$ mixed gas is replaced with the Ar gas and the oxynitridation processing is terminated.

Following the oxynitride film formation described above, by conducting electrode formation processing, passivation film formation processing, hydrogen sintering processing, and the like, a semiconductor integrated circuit device having transistors or capacitors is completed.

Measurement of the effective dielectric constant conducted on a laminated gate insulation film thus formed has revealed the value of approximately 6. Also, electric properties and reliability characteristics, such as leakage current characteristic, breakdown voltage characteristic, and hot-carrier resistance, were excellent as in the case of the first embodiment. The gate insulation film thus obtained showed no dependence on the surface orientation of the silicon substrate 103, and the gate insulation film having excellent characteristics was formed also on the silicon of any surface orientation other than the (100) surface. In this manner, the gate insulation film having both the low interface state properties of the oxide film and the high dielectric constant characteristics of the nitride film was realized.

This embodiment explained the two-layer construction of an oxide film and a nitride film, where the oxide film is located closer to the silicon side. However, it is also possible to change the order of the oxide film and the nitride film according to the proposes. In addition, it is also possible to form a laminated film having more number of films, such as oxide film/nitride film/oxide film, nitride film/oxide film/nitride film, and the like.

(Fourth Embodiment)

Next, a description will be given of an embodiment that uses an oxynitride film formed at low temperature by using plasma for the gate insulation film.

It should be noted that the oxynitride film formation apparatus used in this embodiment is identical with that of FIG. 1. In this embodiment, Kr is used for the plasma excitation gas.

First, the interior of the vacuum vessel (processing camber) 101 is evacuated to vacuum, and an Ar gas is introduced into the processing chamber 101 from the shower plate 102. Next, the gas introduced to the processing chamber 101 is switched to a Kr gas from the Ar gas, and the pressure inside the processing chamber is set to about 133 Pa (1 Torr).

In addition, the silicon substrate 103, subjected to diluted hydrofluoric acid cleaning and the silicon dangling bonds at the surface are terminated by hydrogen in the preprocessing step immediately before, is introduced into the processing chamber 101 and is placed on the stage 104 having the heating mechanism. Further, the temperature of the specimen is set to 400° C.

Next, a microwave having the frequency of 2.45 GHz is supplied to the radial line slot antenna 106 from the coaxial waveguide 105 for 1 minute, wherein the microwave is introduced into the processing chamber 107 from the radial lien slot antenna 106 through the dielectric plate 107. Thereby, there is generated high-density plasma of Kr in the processing chamber 101. The surface-terminating hydrogen is removed by exposing the surface of the silicon substrate 103 to the plasma thus excited by the Kr gas.

Next, the pressure of the processing chamber 101 is maintained at about 133 Pa (1 Torr) and a mixed gas of $Kr/O_2/NH_3$ is introduced from the shower plate 102 with the partial pressure ratio of 96.5/3/0.5. Thereby, a silicon oxynitride film of 3.5 nm is formed on the silicon surface. Upon formation of the silicon oxynitride film of the desire film thickness, the introduction of the microwave power is shutdown and the plasma excitation is terminated. Further, the $Kr/O_2/NH_3$ mixed gas is replaced with the Ar gas and the oxynitridation processing is terminated.

Following the oxide film formation described above, by conducting electrode formation processing, passivation film formation processes, hydrogen sintering processes, and the like, a semiconductor integrated circuit device having transistors or capacitors is completed.

Figure 8:
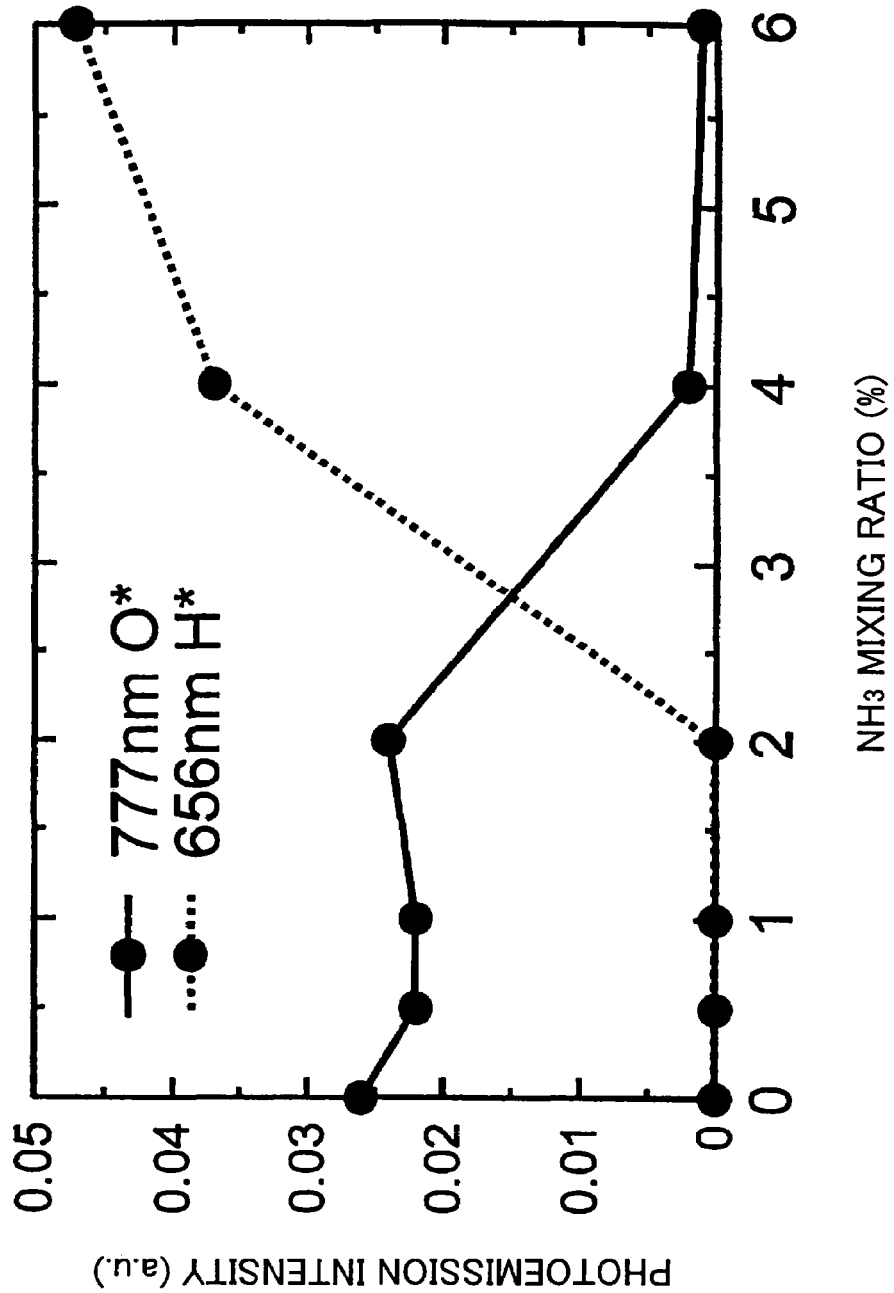
FIG. 8 is a characteristic diagram showing the photoemission intensity of atomic state oxygen and atomic state hydrogen at the time of formation of the silicon oxynitride film.

As shown in FIG. 8, the formation density of the atomic state oxygen O* as measured by the photoemission analysis does not change substantially when the mixing ratio of the $Kr/O_2/NH_3$ gas is in the range of 97/3/0–95/3/2. However, when the ratio of $NH_3$ is increased further, the amount of formation of the atomic state oxygen O* is reduced and the amount of the atomic state hydrogen is increased. Particularly, in the case where the mixing ratio of the $Kr/O_2/NH_3$ gas is about 96.5/3/0.5, the leakage current becomes minimum and the withstand voltage and the resistance against electric charge injection are improved.

Figure 9:
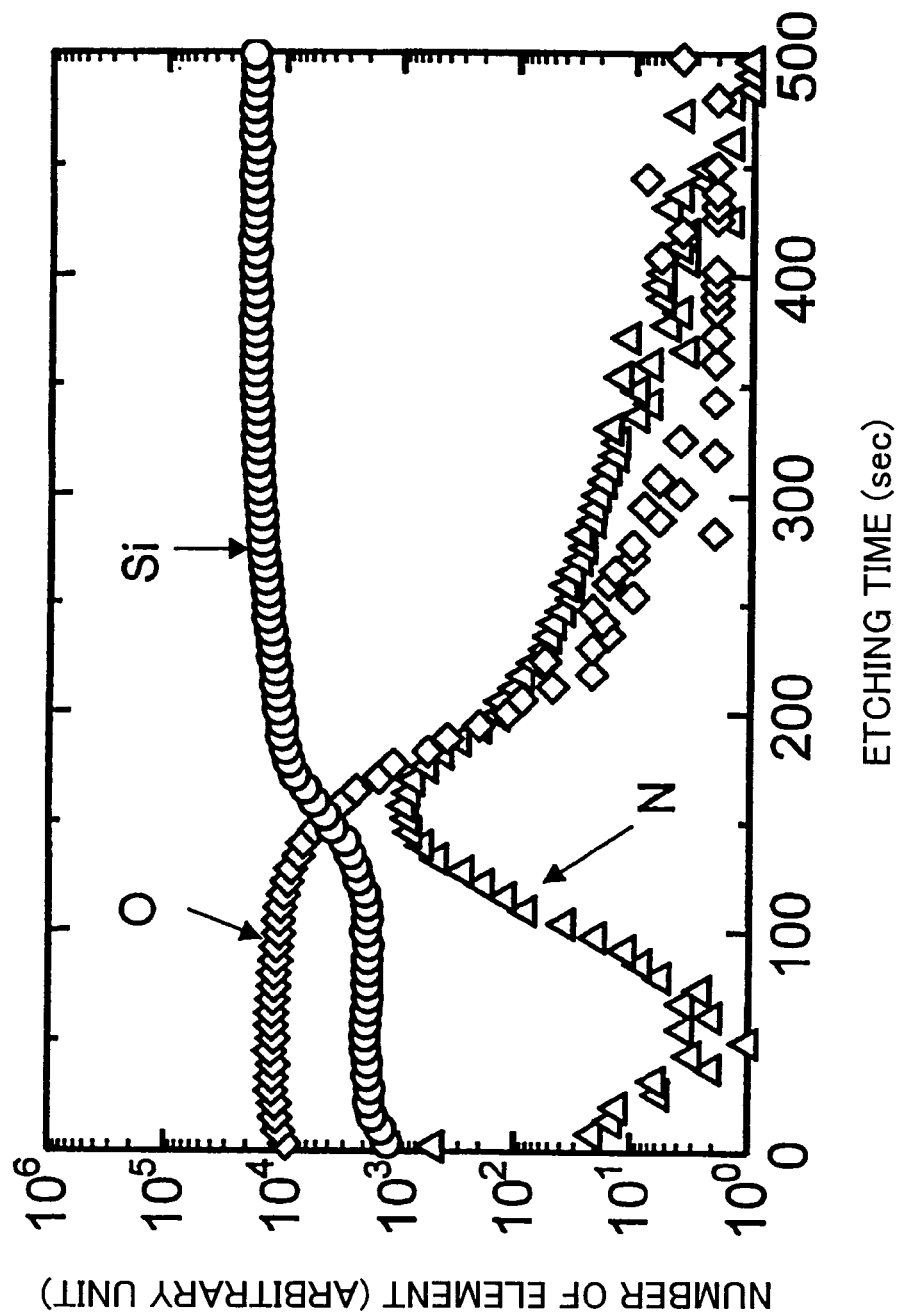
FIG. 9 is a characteristic diagram showing the elemental distribution in the silicon oxynitride film.

FIG. 9 shows the concentration distribution of silicon, oxygen, and nitrogen in the oxynitride film of the this embodiment as measured by a secondary ion mass spectrometer. It should be noted that, in FIG. 9, the horizontal axis represents the depth as measured from the surface of the oxynitride film. In FIG. 9, it can be seen that the distribution of silicon, oxygen, and nitrogen is changing gently in the film. However, this is caused by non-uniformity of etching and does not mean that the film thickness of the oxynitride film is uneven.

Referring to FIG. 9, it can be seen that the concentration of nitrogen in the oxynitride film is high at the silicon/silicon oxynitride film interface and at the silicon oxynitride film surface, and decreases at the central part of the oxynitride film. The amount of nitrogen incorporated into the oxynitride film is several ten percent or less as compared with silicon or oxygen.

Figure 10:
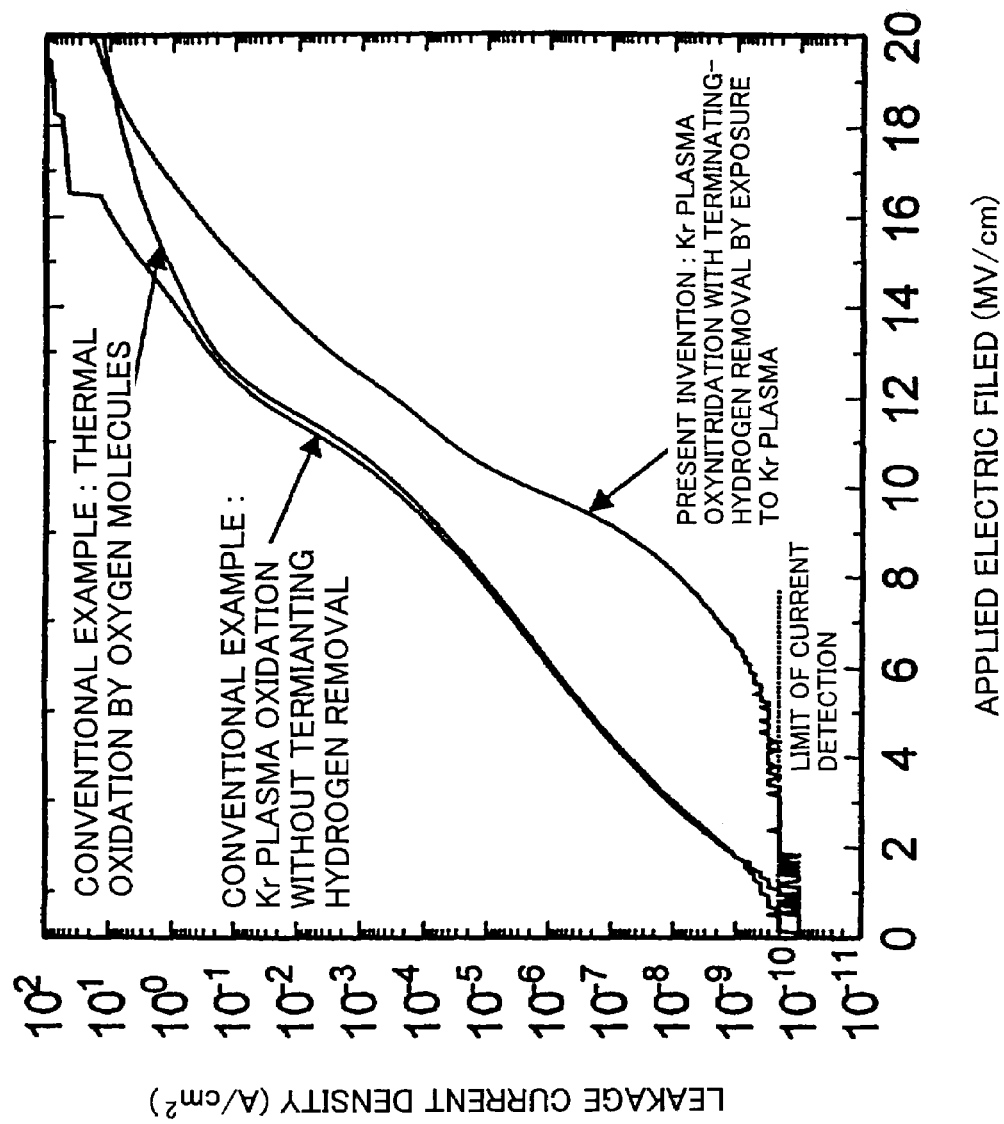
FIG. 10 is a characteristic diagram showing the current versus voltage characteristic of the silicon oxynitride film.

FIG. 10 shows the dependence of leakage current of the oxynitride film of the this embodiment on the applied electric field. It should be noted that, however, FIG. 10 also shows the leakage current characteristic of the oxide film of the same film thickness in which the exposure process to the Kr plasma is not conducted before the oxide film formation by the microwave plasma and the leakage current characteristic of the oxide film formed by a thermal oxidation process for the purpose of comparison.

Referring to FIG. 10, it can be seen that, as compared with the oxide film formed by the conventional technique, the value of the leakage current at the same electric field is reduced by the order of 2–4 in the oxynitride film of the this embodiment in which the oxynitridation processing is conducted by introducing the $Kr/O_2/NH_3$ gas after removing the terminating hydrogen by the Kr plasma irradiation and that excellent low-leakage characteristics are obtained.

It should be noted that, in FIG. 6 explained before, the relationship between the leakage current characteristic and the film thickness of the oxynitride film thus formed is represented by ■.

Referring to FIG. 6 again, it can be seen that the oxynitride film formed by this embodiment after conducting the Kr irradiation has a similar leakage characteristic to the oxide film formed with a similar process and, particularly, the leakage current is only $1 \times 10^{-2} A/cm^2$ also in the case where the film thickness is approximately 1.6 nm.

It should be noted that the oxynitride film of this embodiment also showed excellent electric properties and reliability characteristics, such as breakdown voltage characteristic and hot carrier resistance, superior to the oxide film of the first embodiment described above. Further, there was observed no dependence on the surface orientation of the silicon substrate, and thus, it is possible to form a gate insulation film of excellent characteristic not only on the (100) surface of silicon but also on the silicon surface of any surface orientation.

As described above, it is possible to form a silicon oxynitride film of excellent characteristics and film quality on the silicon surface of any surface orientation even at the low temperature of 400° C. by conducting the silicon oxynitridation processing by using the $Kr/O_2/NH_3$ high-density plasma, after removing the surface-terminating hydrogen.

The reason why such preferable effect can be achieved by this embodiment is attributed not only to the reduction of hydrogen content in the oxynitride film caused by removal of the surface-terminating hydrogen, but also to the nitrogen contained in the oxynitride film with a proportion of several ten percent or less. In the oxynitride film of this embodiment, the content of Kr is approximately 1/10 or less as compared with the oxide film of the first embodiment, and in place of Kr, a large amount of nitrogen is contained. That is, in this embodiment, it is believed that the reduction of hydrogen in the oxynitride film causes reduction of weak bonds in the silicon oxynitride film, the existence of nitrogen causes relaxation of stress in the film or at the $Si/SiO_2$ interface, and consequently, trapped electrical charges in the film or the surface state density is reduced, and the electric properties of the oxynitride film is improved significantly. Particularly, it is believed the reduction of hydrogen concentration in the oxynitride film to $10^{22} cm^{-2}$ or less, more preferably, $10^{11} cm^{-2}$ or less, and the existence of nitrogen in the film with a proportion of several ten percent with respect to silicon or oxygen contribute to the improvement of the electric properties and reliability characteristics of the silicon oxynitride film.

In this embodiment, the oxynitridation processing is terminated such that the introduction of the microwave power is shutdown at the end of the oxynitridation processing upon formation of the silicon oxynitride film with the desired thickness, and the $Kr/O_2/NH_3$ mixed gas is replaced with the Ar gas. On the other hand, it is also possible to terminate the oxynitridation processing by introducing a $Kr/NH_3$ mixed gas with the partial pressure ratio of 98/2 from the shower plate 102 before the shutdown of the microwave power while maintaining the pressure at about 133 Pa (1 Torr) and form a silicon nitride film on the surface of the silicon oxynitride film with the thickness of approximately 0.7 nm.

According to this method, a silicon nitride film is formed on the surface of the silicon oxynitride film and an insulation film having a higher dielectric constant can be formed.

(Fifth Embodiment)

Next, a description will be given of a fabrication method of a semiconductor device according to a fifth embodiment of the present invention in which semiconductor device a high-quality silicon oxide film formed on a corner part of the device isolation sidewall that constitutes a shallow-trench isolation or on a silicon surface having a surface form with projections and depressions.

Figure 11A:
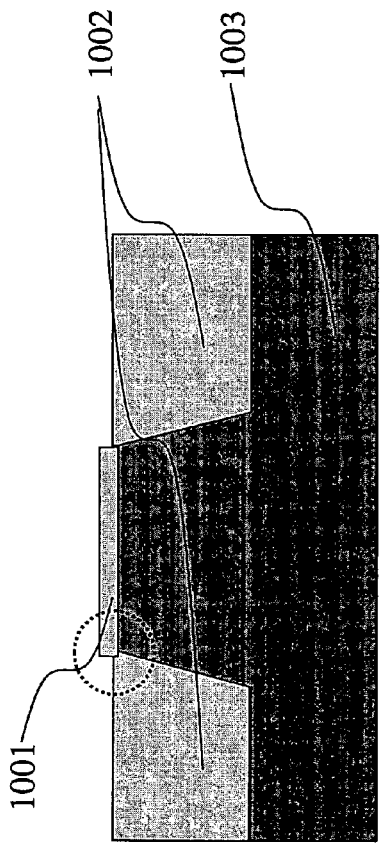
FIGS. 11A–11C are conceptual cross-sectional views of the shallow trench isolation.

FIG. 11A shows a conceptual diagram of shallow trench isolation.

Referring to FIG. 11A, the illustrated shallow trench isolation is formed by forming an isolation trench on a surface of a silicon substrate 1003 by conducting a plasma etching, filling the trench thus formed with a silicon oxide film 1002 formed by a CVD method, and planarizing the silicon oxide film 1002 by a CMP method, and the like.

In this embodiment, the silicon substrate is exposed to an oxidizing atmosphere at 800–900° C. after the polishing step of the silicon oxide film 1002 according to the CMP method to conduct sacrifice oxidation, and the silicon oxide film formed by the sacrifice oxidation is etched away in a chemical solution containing hydrofluoric acid. Thereby, a silicon surface terminated with hydrogen is obtained. In this embodiment, the surface-terminating hydrogen is removed by using the Kr plasma with a procedure similar to the one in the first embodiment. Thereafter, the Kr/O2 gas is introduced and the silicon oxide film is formed with the thickness of approximately 2.5 nm.

Figure 11B:
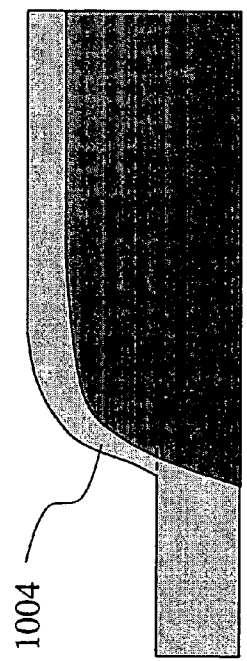
Figure 11C:
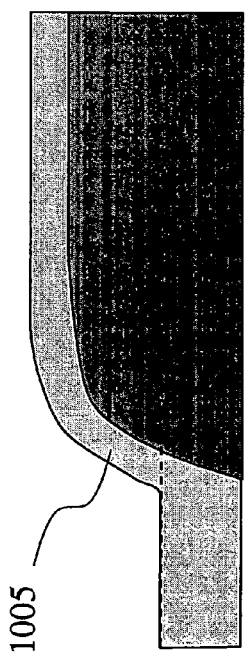

According to this embodiment, as shown in FIG. 11C, the silicon oxide film is formed with a uniform thickness even on the corner part of the shallow trench isolation without causing decrease of silicon oxide film thickness. The silicon oxide film formed by the plasma oxidation method using the Kr plasma has excellent QBD (Charge to Breakdown) characteristics including the shallow trench isolation part, and there is caused no increase of leakage current even in the case where the amount of the injected electric charges are $10^2 C/cm^2$. Thus, the reliability of the device is improved significantly.

In the case of forming the silicon oxide film by the conventional thermal oxidation method, as shown in FIG. 11B, the thinning of the film becomes severe at the corner part of the shallow trench isolation with increasing taper angle of the shallow trench isolation. However, in the case of the plasma oxidation of the present invention, no such thinning of the silicon oxide film is caused at the corner part of the shallow trench isolation even when the taper angle is increased. Thus, in this embodiment, by making the taper angle for the trench near the right angle in the shallow trench isolation structure, it is possible to reduce the area of the device isolation region and further increase integration density in the semiconductor device. The taper angle of about 70 degrees has been used for the device isolation part in the conventional thermal oxidation technology, because of the limitation caused by the thinning of the thermal oxide film at the trench corner part as shown in FIG. 11B. According to the present invention, however, it is possible to use the angle of 90 degrees.

Figure 12:
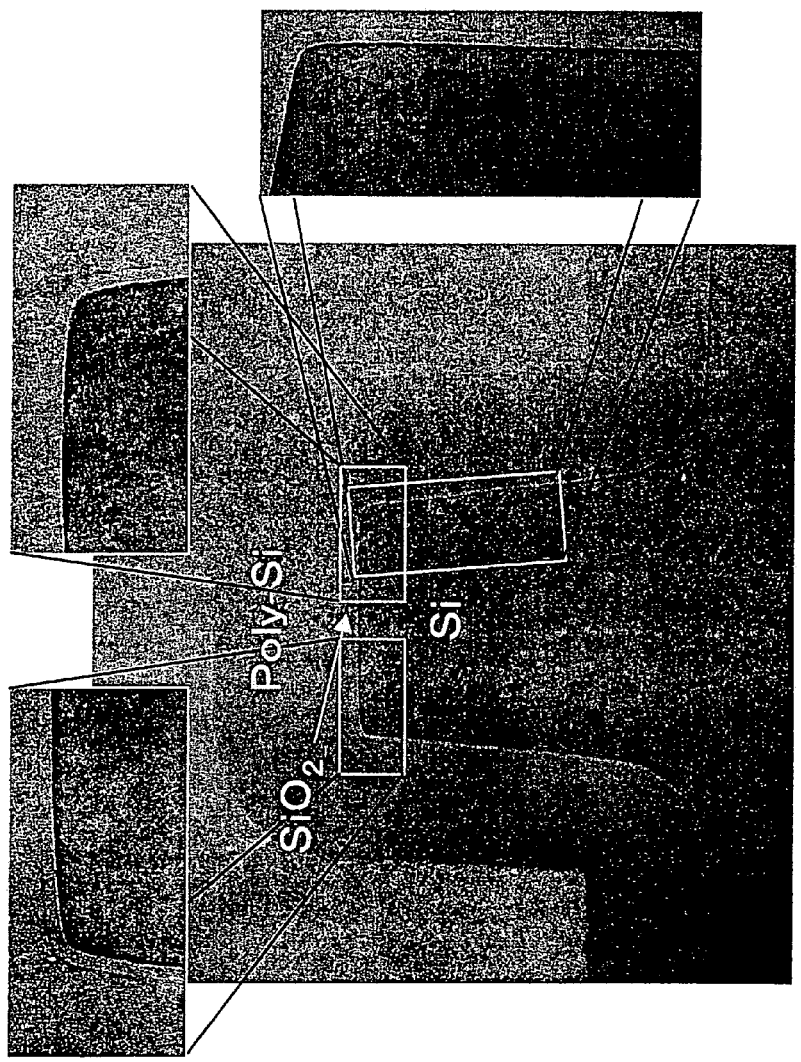
FIG. 12 is a cross-sectional view of a three-dimensional transistor formed on a silicon surface having projections and depressions.

FIG. 12 shows the cross-sectional view of the silicon oxide film formed on a silicon substrate having an undulating surface form formed by conducting a 90-degree etching on the silicon substrate, with a thickness of 3 nm according to the procedure of the first embodiment.

Referring to FIG. 12, it can be confirmed that a silicon oxide film of uniform thickness is formed on any of the surfaces.

The oxide film formed as described above has good electric properties such as leakage current or breakdown voltage. Thus, the present invention can realize a high-density semiconductor integrated device having a silicon three-dimensional structure that includes plural surface orientations such as a vertical structure.

(Sixth Embodiment)

Next, a description will be given of a flash memory device according to a sixth embodiment of the present invention that uses the formation technology of oxide film and nitride film or that of oxynitride film at low temperature by using plasma. In the description below, it should be noted that the explanation is made by taking a flash memory device as an example, however, the present invention is applicable also to EPROMs, EEPROMs, and the like.

Figure 13:
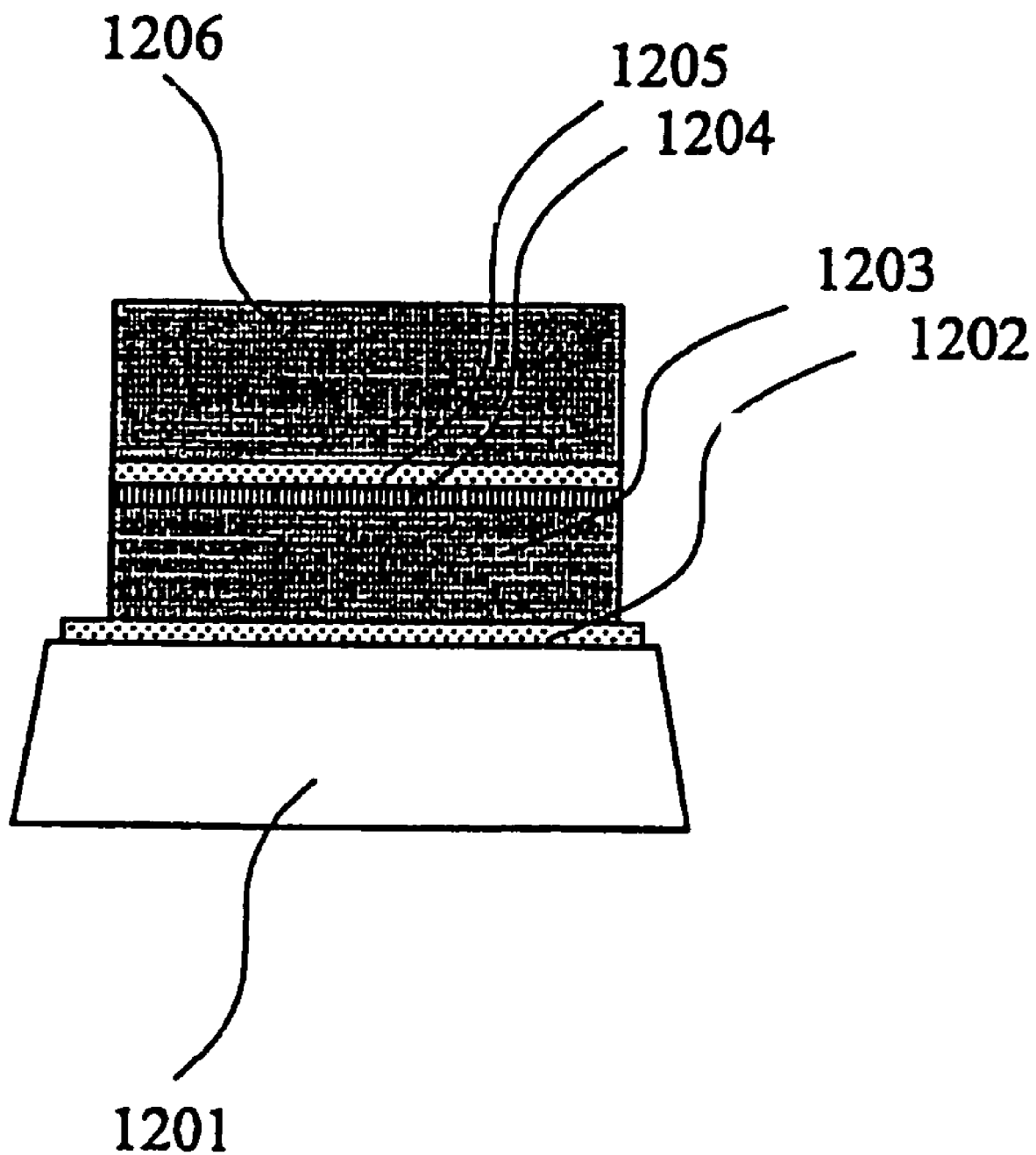
FIG. 13 is a schematic diagram of a cross-sectional structure of a flash memory device.

FIG. 13 shows the schematic cross-sectional view of a flash memory device according to this embodiment.

Referring to FIG. 13, the flash memory device is constructed on a silicon substrate 1201 and includes a tunneling oxide film 1202 formed on the silicon substrate 1201, a first polysilicon gate electrode 1203 formed on the tunneling oxide film 1202 as a floating gate electrode, a silicon oxide film 1204 and a silicon nitride film 1205 formed consecutively on the polysilicon gate electrode 1203, and a second polysilicon gate electrode 1206 formed on the silicon nitride film 1205 as a control gate electrode. In FIG. 13, illustration of the source region, drain region, contact hole, wiring patterns, and the like, is omitted. It should be noted that the silicon oxide film 1202 is formed by the silicon oxide film formation method explained in the first embodiment, and the laminated structure of the silicon oxide film 1204 and the nitride film 1205 is formed by the formation method of silicon nitride film explained in the third embodiment.

FIGS. 14–17 are schematic cross-sectional views for explaining the fabrication method of the flash memory device of this embodiment step by step.

Figure 14:
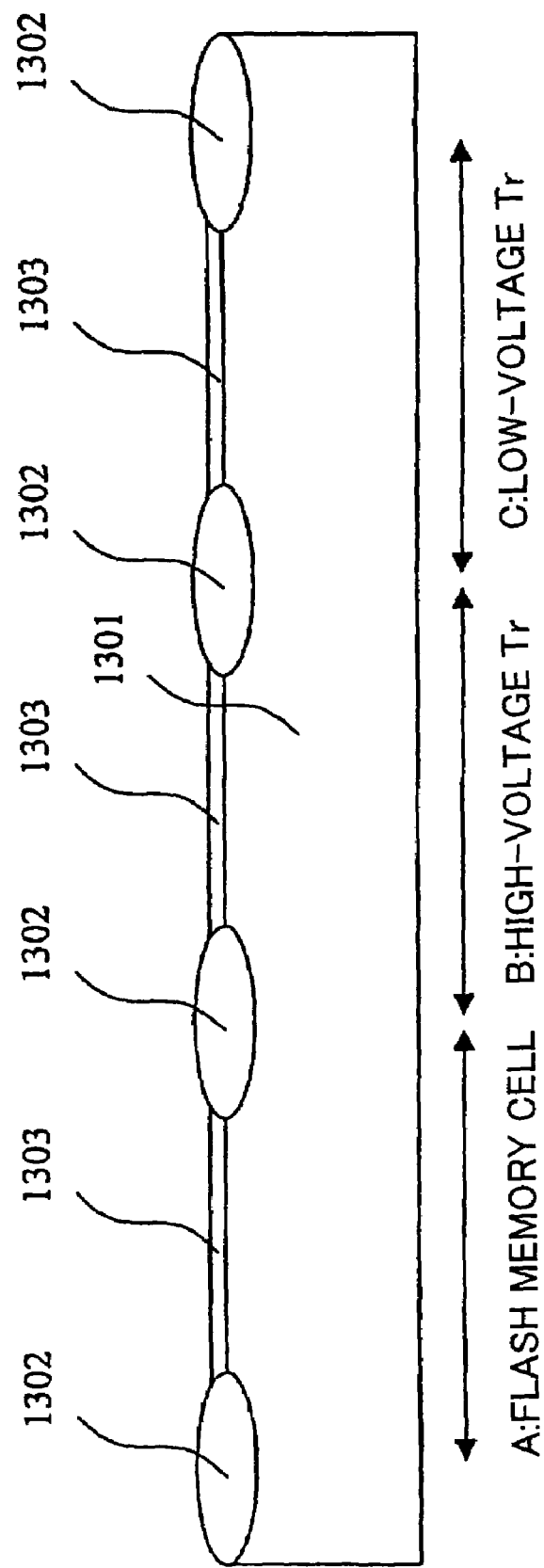
FIG. 14 is a schematic cross-sectional view for explaining the fabrication method of the flash memory device of the present invention step by step.

Referring to FIG. 14, a silicon substrate 1301 includes a flash memory cell region A, a high-voltage transistor region B, and a low-voltage transistor region C that are defined by a field oxide film 1302, wherein a silicon oxide film 1303 is formed on the surface of the silicon substrate 301 in each of the regions A–C. The field oxide film 1302 may be formed by a selective oxidation process (LOCOS method) or shallow trench isolation method.

In this embodiment, Kr is used as the plasma excitation gas for the removal of the surface-terminating hydrogen or for the formation of the oxide film and the nitride film. The oxide film and nitride film formation apparatus is identical with that of FIG. 1.

Figure 15:
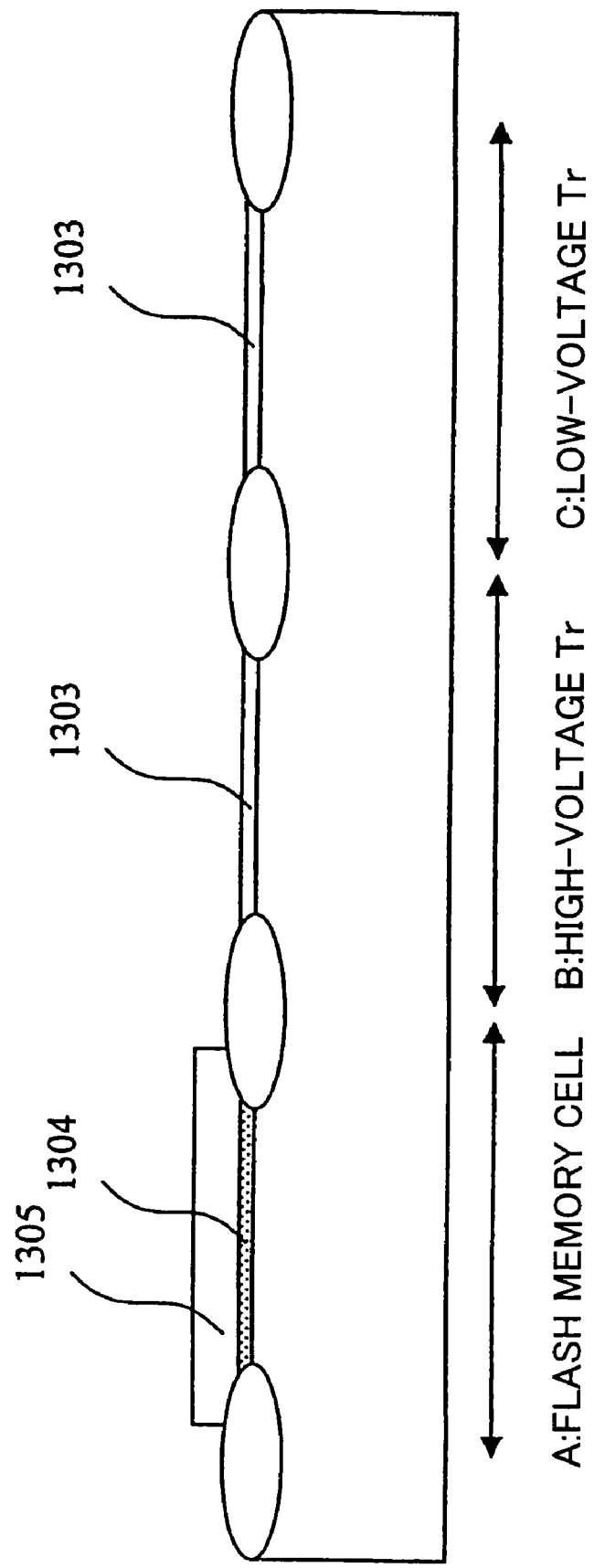
FIG. 15 is a schematic cross-sectional view for explaining the fabrication method of the flash memory device of the present invention step by step.

Next, in the step of FIG. 15, the silicon oxide film 1303 is removed from the memory cell region A, and the silicon surface is terminated by hydrogen by diluted hydrofluoric acid cleaning. Further, a tunneling oxide film 1304 is formed similarly to the first embodiment described above.

That is, as in the above-described first embodiment, the vacuum vessel (processing chamber) 101 is evacuated to vacuum and the Ar gas is introduced into the processing chamber 101 from the shower plate 102. Next, the Ar gas is switched to the Kr gas and the pressure in the processing chamber 101 is set to about 1 Torr.

Next, the silicon oxide film 1303 is removed and the silicon substrate subjected to the diluted hydrofluoric acid treatment is introduced into the processing chamber 101 as the silicon substrate 103 of FIG. 1 and is placed on the stage 104 having the heating mechanism. Further, the temperature of the substrate is set to 400° C.

Further, a microwave having the frequency of 2.45 GHz is supplied from the coaxial waveguide 105 to the radial line slot antenna 106 for 1 minute, wherein the microwave is introduced into the processing chamber 101 from the radial line slot antenna 106 through the dielectric plate 107. By exposing the surface of the silicon substrate 1301 to the high-density Kr plasma thus formed in the processing chamber 101, the terminating hydrogen are removed from the silicon surface of the substrate 1301.

Then, the Kr gas and the $O_2$ gas are introduced from the shower plate 102, and the silicon oxide film 1304 used for the tunneling insulation film is formed on the region A with a thickness of 3.5 nm. Subsequently, a first polysilicon layer 1305 is deposited so as to cover the silicon oxide film 1304.

Next, the first polysilicon layer 1305 is removed from the high voltage and low voltage transistor formation regions B and C, respectively, by a patterning process, such that the first polysilicon pattern 1305 is left only on the tunneling oxide film 1304 in the memory cell region A.

After this etching, cleaning is conducted and the surface of the polysilicon pattern 1305 is terminated with hydrogen.

Figure 16:
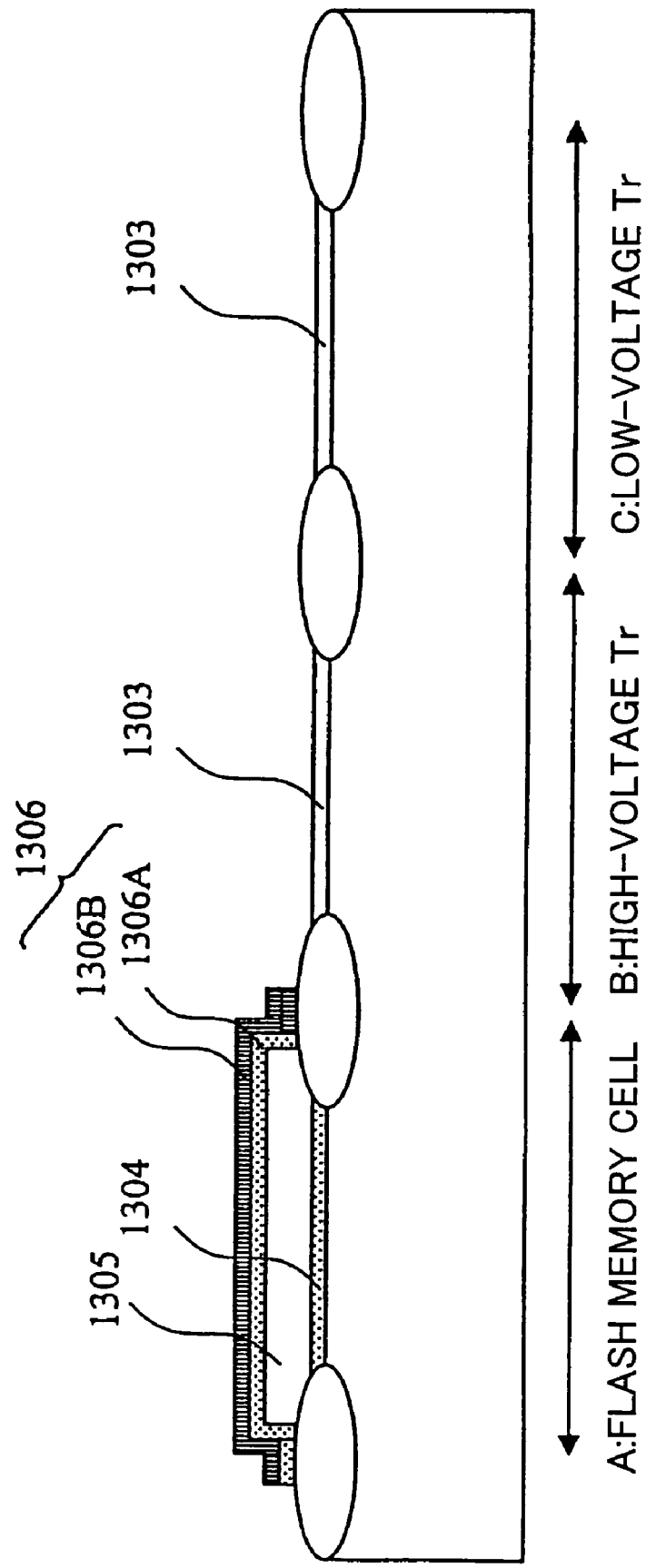
FIG. 16 is a schematic cross-sectional view for explaining the fabrication method of the flash memory device of the present invention step by step.

Next, in the step of FIG. 16, as in the third embodiment described above, an insulation film 1306 having an ON structure of a lower oxide film 1306A and an upper nitride film 1306B is formed so as to cover the surface of the polysilicon pattern 1305 similarly to the third embodiment.

The ON film is formed as follows.

The vacuum vessel (processing chamber) 101 is evacuated to vacuum and the Ar gas introduced from the shower plate 102 is switched to the Kr gas. In addition, the pressure inside the processing chamber is set to about 133 Pa (1 Torr). Next, the silicon substrate 1301 carrying the polysilicon pattern 1305 in the state that the hydrogen termination is made is introduced into the processing chamber 101 and is placed on the stage 104 having the heating mechanism. Further, the temperature of the specimen is set to 400° C.

Next, a microwave having the frequency of 2.45 GHz is supplied to the radial line slot antenna 106 from the coaxial waveguide 105 for about 1 minute, wherein the microwave is introduced into the processing chamber 101 from the radial line slot antenna 106 through the dielectric plate 107, and there is generated a high-density Kr plasma. As a result, the surface of the polysilicon pattern 1305 is exposed to the Kr gas and the surface terminating hydrogen is removed.

Next, a $Kr/O_2$ mixed gas is introduced into the processing chamber 101 from the shower plate 102 while maintaining the pressure inside the processing chamber 101 to about 133 Pa (1 Torr), and a silicon oxide film is formed on the polysilicon surface with a thickness of 3 nm.

Next, after the supply of the microwave is shutdown temporarily, the introduction of the Kr gas and the $O_2$ gas is interrupted. The interior of the vacuum vessel (processing chamber) 101 is evacuated, and the Kr gas and an $NH_3$ gas are introduced from the shower plate 102. The pressure inside the processing chamber 101 is set to about 13.3 Pa (100 mTorr) and the microwave of 2.45 GHz is supplied again into the processing chamber 101 via the radial line slot antenna 106. Thereby, high-density plasma is generated in the processing chamber and a silicon nitride film is formed on the silicon oxide film surface with the thickness of 6 nm.

When an ON film with a thickness of 9 nm was formed as described above, the film thickness of the ON film thus obtained was uniform, and no dependence on the polysilicon surface orientation was observed. Thus, it was realized that the extremely uniform film could be obtained.

Figure 17:
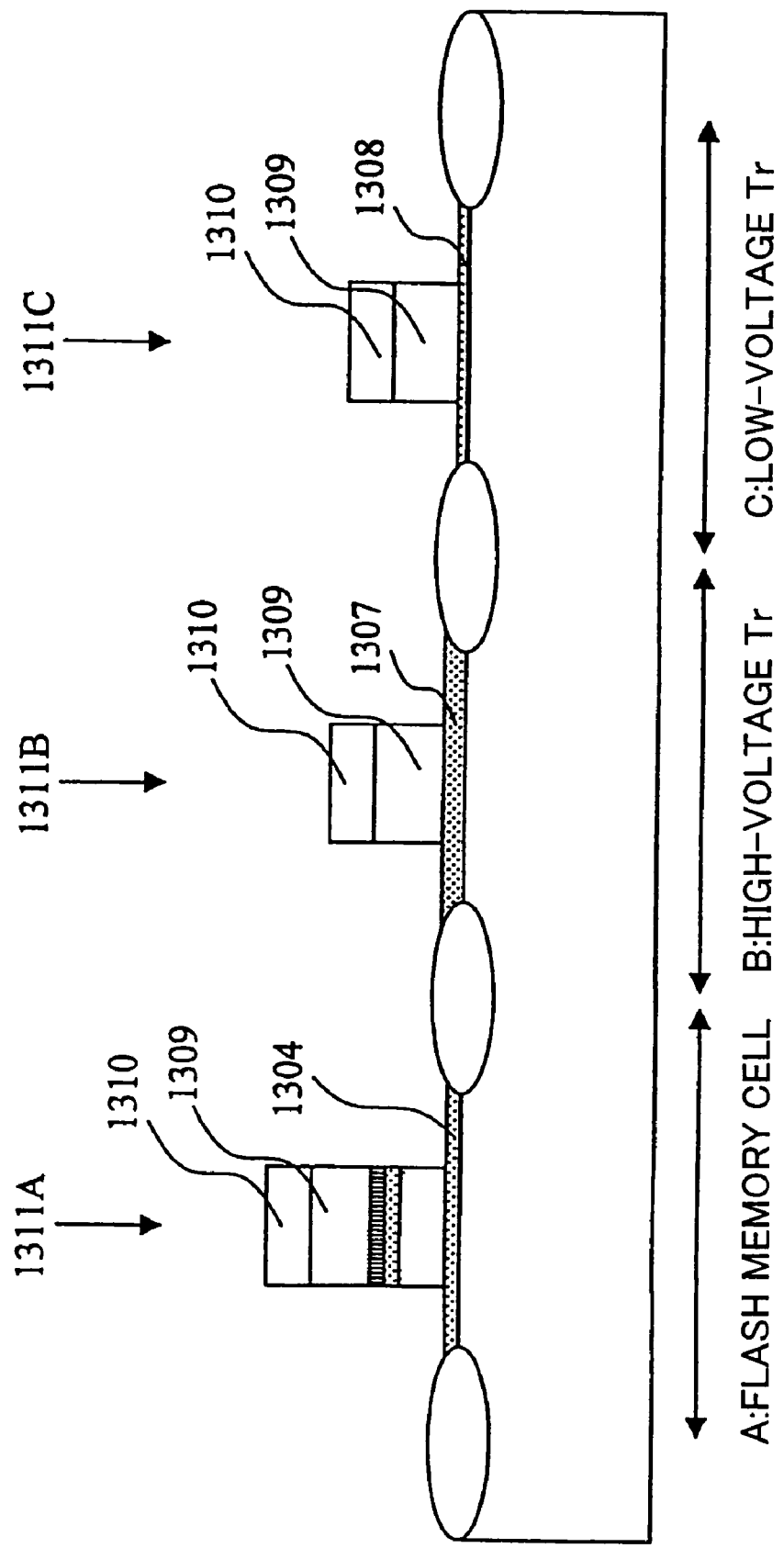
FIG. 17 is a schematic cross-sectional view for explaining the fabrication method of the flash memory device of the present invention step by step.

After such a process of formation of the ON film, the insulation film 1306 is removed from the high-voltage and low-voltage transistor regions B and C, respectively, by gate patterning in the step of FIG. 17, and then, ion implantation for threshold voltage control is conducted on the high-voltage and low-voltage transistor regions B and C, respectively. Further, the oxide film 1303 formed on the regions B and C is removed, and a gate oxide film 1307 is formed on the region B with a thickness of 5 nm. Thereafter, a gate oxide film 1308 is formed on the region C with a thickness of 3 nm.

Then, a second polysilicon layer 1309 and a silicide layer 1310 are formed consecutively on the entire structure including the field oxide film 1302. In addition, gate electrodes 1311B and 1311C are formed in the high-voltage transistor region B and the low-voltage transistor region C, respectively, by patterning the second polysilicon layer 1309 and the silicide layer 1310. Further, a gate electrode 1311A is formed in correspondence to the memory cell region A.

After the step of FIG. 17, source and drain regions are formed according to a standard semiconductor process, and the device is completed by conducting formation of inter-layer insulation films and contact holes and formation of wiring patterns.

In the present invention, it should be noted that the insulation films 1306A and 1306B maintain good electric properties even when the thickness thereof is reduced to about one half the conventional thickness of the oxide film or nitride film. In other words, these silicon oxide film 1306A and silicon nitride film 1306B maintain good electric properties even when the thickness thereof is reduced, are dense, and have high quality. Further, it should be noted that, because the silicon oxide film 1306A and the silicon nitride film 1306B are formed at low temperature, there occurs no thermal budget or the like at the interface between the gate polysilicon and the oxide film, and good interface is obtained.

The flash memory device of the present invention can perform writing and erasing operations of information at low voltage and suppress the generation of substrate current. Thereby, deterioration of the tunneling insulation film is suppressed. Hence, a non-volatile semiconductor memory in which the flash memory devices of the present invention are arranged in a two-dimensional array can be produced with high yield and shows stable characteristics.

In the flash memory device of the present invention, the leakage current is small due to the excellent film quality of the insulation films 1306A and 1306B. Also, it is possible to reduce the film thickness without increasing the leakage current. Thus, it becomes possible to perform the writing or erasing operation at an operational voltage of about 5V. As a result, the memory retention time of the flash memory device is increased by the order of 2 or more as compared with the conventional one, and the number of times of possible rewriting operation is increased by the order of 2 or more.

It should be noted that the film structure of the insulation film 1306 is not limited to the ON structure explained above, but it is also possible to use an O structure formed of an oxide film similar to that of the first embodiment, an N structure formed of a nitride film similar to that of the second embodiment, or an oxynitride film similar to the one in the fourth embodiment. Further, the insulation film 1306 may have an NO structure formed of a nitride film and an oxide film, an ONO structure in which an oxide film, a nitride film, and an oxide film are laminated consecutively, or an NONO structure in which a nitride film, an oxide film, a nitride film, and an oxide film are laminated consecutively. Choice of any of the foregoing structures can be made according to the purpose from the viewpoint of compatibility with the gate insulation film in the high voltage transistor or low voltage transistor in the peripheral circuit or from the viewpoint of possibility of shared use.

(Seventh Embodiment)

It should be noted that the formation of the gate insulation film by using the foregoing $Kr/O_2$ microwave-excited high-density plasma or the formation of the gate nitride film by using the Ar (or Kr)/$NH_3$ (or $N_2/H_2$) microwave-excited high-density plasma by using the apparatus of FIG. 1 is applicable to the formation of a semiconductor integrated circuit device on a silicon-on-insulator (metal-substrate SOI) wafer including a metal layer in the underlying silicon in which metal-substrate SOI conventional high temperature process is not possible. Particularly, the effect of removal of the terminating hydrogen appears conspicuously in the SOI structure having a small silicon film thickness and performing completely depleted operation.

Figure 18:
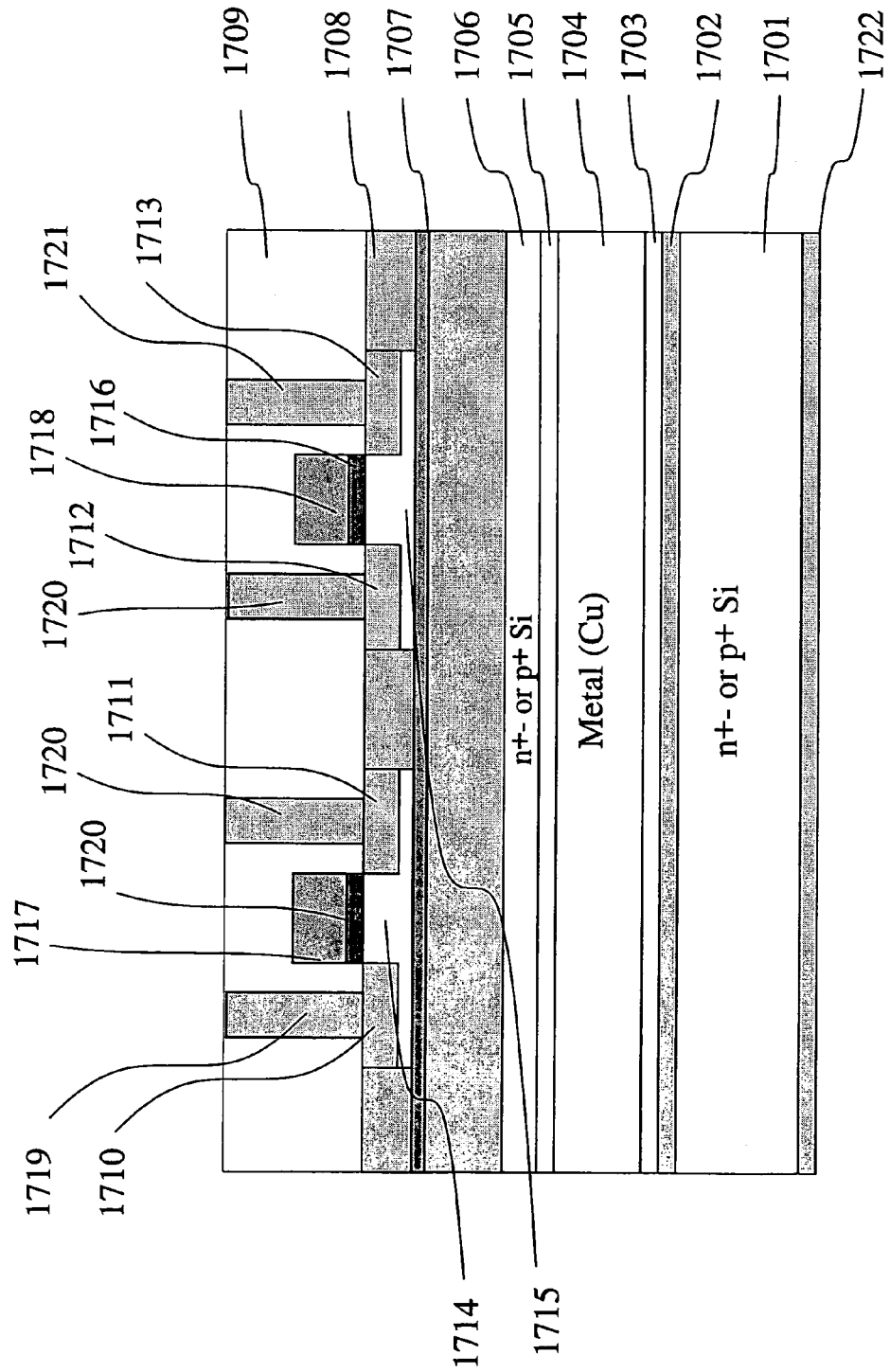
FIG. 18 is a schematic diagram of a cross-sectional structure of a MOS transistor formed on a metal substrate SOI.

FIG. 18 shows a cross-sectional view of a MOS transistor having a metal-substrate SOI structure.

Referring to FIG. 18, 1701 is a low-resistance semiconductor layer of $n^+$-type or $p^+$-type, 1702 is a silicide layer of such as NiSi, 1703 is a conductive nitride layer such as TaN or TiN, 1704 is a metal layer of such as Cu, 1705 is a conductive nitride layer of such as TaN or TiN, 1706 is a low-resistance semiconductor layer of $n^+$-type or $p^+$-type, 1707 is a nitride insulation film such as AlN, $Si_3N_4$, and the like, 1708 is an $SiO_2$ film, 1709 is an $SiO_2$ layer or a BPSG layer or an insulation layer combining these, 1710 is a drain region of $n^+$-type, 1711 is a source region of $n^+$-type, 1712 is a drain region of $p^+$-type, 1713 is a source region of $p^+$-type, 1714 and 1715 are silicon semiconductor layers oriented in the <111> direction, 1716 is an $SiO_2$ film formed by the $Kr/O_2$ microwave-excited high-density plasma after removing the surface-terminating hydrogen by Kr plasma irradiation according to the procedure of the first embodiment of the present invention, 1717 and 1718 are respectively the gate electrodes of an n-MOS transistor and a p-MOS transistor and formed of Ta, Ti, TaN/Ta, TiN/Ti, and the like, 1719 is a source electrode of the n-MOS transistor, and 1720 is a drain electrode of the n-MOS transistor and a p-MOS transistor. Further, 1721 is a source electrode of a p-MOS transistor and 1722 is a substrate surface electrode.

In such a substrate including a Cu layer and protected by TaN or TiN, the temperature of thermal processing has to be about 700° C. or less for suppressing diffusion of Cu. The source or drain region of $n^+$-type or $p^+$-type is formed by conducting the thermal processing at 550° C. after ion implantation of $As^+$, $AsF_2^+$, or $BF_2^+$.

In the semiconductor device having the device structure of FIG. 18, it should be noted that the comparison of the transistor sub-threshold characteristics between the case where a thermal oxide film is used for the gate insulation film and the case where the gate insulation film is formed by the $Kr/O_2$ microwave-excited high-density plasma processing after removing the surface-terminating hydrogen by the Kr plasma irradiation, has revealed the fact that there appears kink or leakage in the sub-threshold characteristics when the gate insulation film is formed by the thermal oxidation, while in the case where the gate insulation film is formed by the present invention, excellent sub-threshold characteristics are obtained.

When a mesa-type device isolation structure is used, it should be noted that there appears a silicon surface having a surface orientation different from that of the silicon flat surface part, at the sidewall part of the mesa device isolation structure. By forming the gate insulation film by the plasma oxidation using Kr, the oxidation of the mesa device isolation sidewall is achieved generally uniformly similarly to the flat surface part, and excellent electric properties and high reliability are obtained.

Further, it is possible to produce a metal-substrate SOI integrated circuit device having excellent electric properties and high reliability also in the case of using a silicon nitride film formed by $Ar/NH_3$ according to the procedure of the second embodiment for the gate insulation film.

In this embodiment, too, it is possible to obtain good electric properties even in the case where the thickness of the silicon nitride film is set to 3 nm (equivalent to the oxide film thickness of 1.5 nm), and the transistor drivability is improved by about twice as compared with the case where a silicon oxide film of 3 nm thickness is used.

(Eighth Embodiment)

Figure 19:
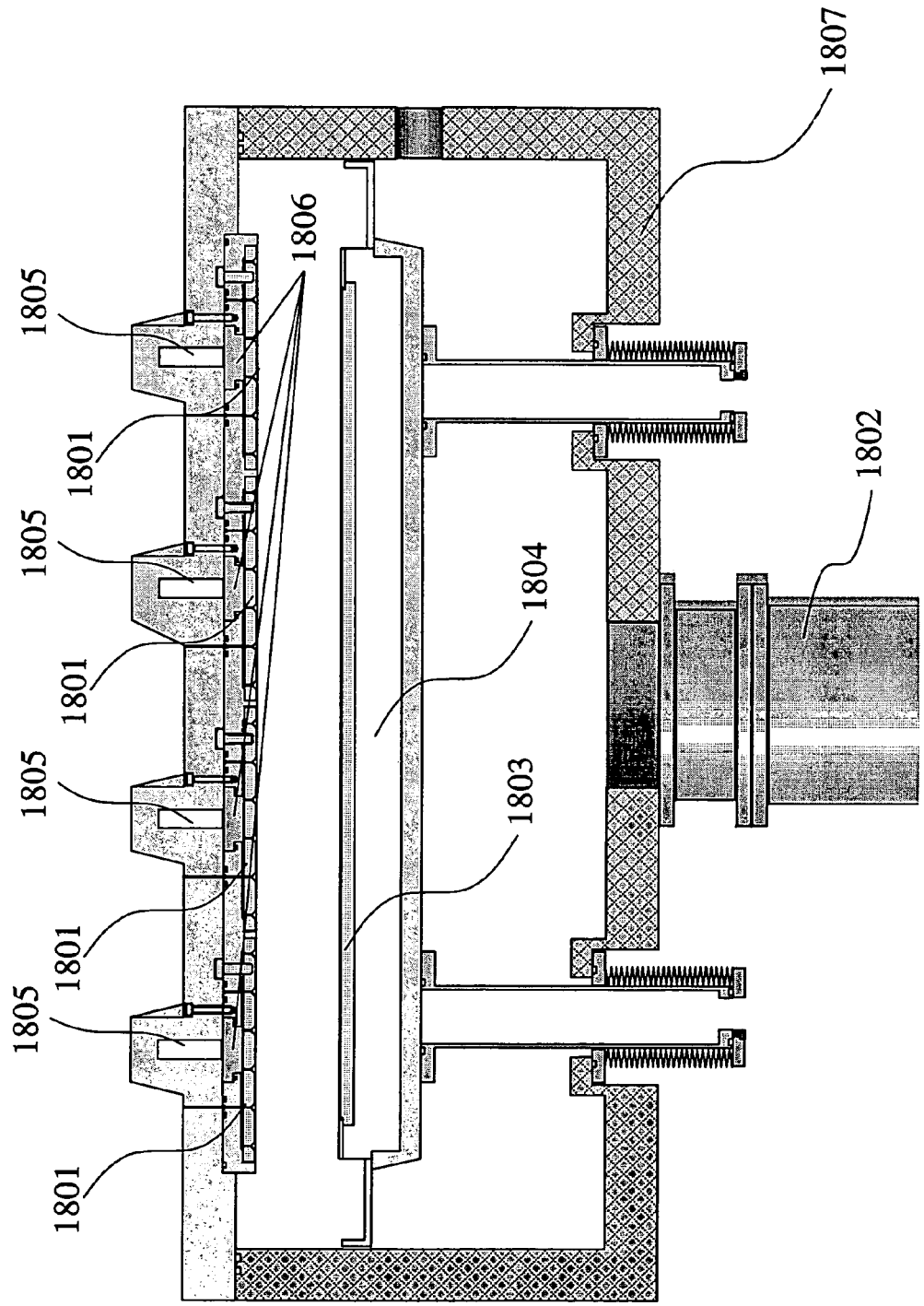
FIG. 19 is a conceptual diagram of a plasma apparatus accommodated to a glass substrate or plastic substrate.

FIG. 19 shows a conceptual diagram illustrating an example of the fabrication apparatus according to an eighth embodiment of the present invention intended to conduct oxidation processing, nitridation processing, or oxynitridation processing on a polysilicon or amorphous silicon layer formed on a large rectangular substrate such as a glass substrate or a plastic substrate on which liquid crystal display devices or organic electro-luminescence devices are formed.

Referring to FIG. 19, a vacuum vessel (processing chamber) 1807 is evacuated to a low pressure state and a $Kr/O_2$ mixed gas is introduced from a shower plate 1801 provided in the processing chamber 1807. Further, the processing chamber 1807 is evacuated by a lead screw pump 1802 such that the pressure inside the processing chamber 1807 is set to 133 Pa (1 Torr). Further, a glass substrate 1803 is placed on a stage 1804 having a heating mechanism, and the temperature of the glass substrate is set to 300° C.

The processing chamber 1807 is provided with a large number of rectangular waveguides 1805 and a microwave is introduced into the processing chamber 1807 from respective slits of the large number of rectangular waveguides 1805 described above via a dielectric plate 1806, and high-density plasma is generated in the processing chamber 1807. On this occasion, the shower plate 1801 provided in the processing chamber 1807 functions also as a waveguide for propagating the microwave emitted by the waveguide in the right and left directions in the form of a surface wave.

Figure 20:
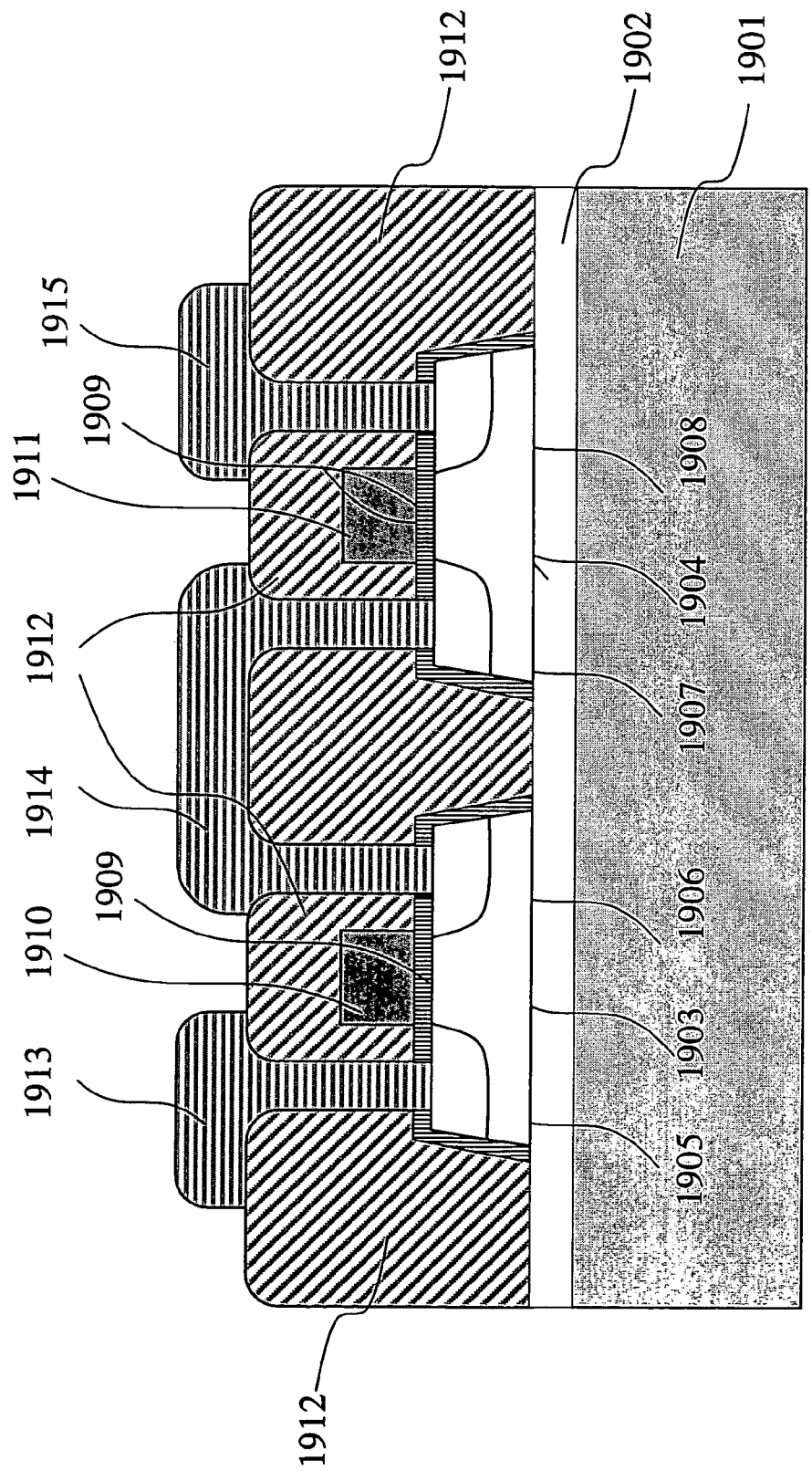
FIG. 20 is a schematic diagram of a cross-sectional structure of a polysilicon transistor on an insulation film.

FIG. 20 shows an example where a polysilicon thin film transistor (TFT), used for driving a liquid crystal display device or an organic EL photoemission device or for use in a processing circuit, is formed by forming the gate oxide film or gate nitride film of the present invention by using the apparatus of FIG. 19.

First, the example of forming and using a silicon oxide film will be explained.

Referring to FIG. 20, 1901 is a glass substrate, 1902 is a $Si_3N_4$ film, 1903 is a channel layer of a polysilicon n-MOS having a predominantly (111)-oriented surface, 1905 and 1906 are respectively a source region and a drain region of the polysilicon n-MOS, 1904 is a channel layer of a polysilicon p-MOS predominantly oriented in the (111) surface, and 1907 and 1908 are respectively a source region and a drain region of the polysilicon p-MOS. Further, 1910 is a gate electrode of the polysilicon n-MOS, and 1911 is a gate electrode of the polysilicon p-MOS, 1912 is an insulation film of such as $SiO_2$, BSG, or BPSG, 1913 and 1914 are respectively the source electrode of the polysilicon n-MOS (and simultaneously the drain electrode of the polysilicon p-MOS), and 1915 is the source electrode of the polysilicon p-MOS.

It should be noted that a polysilicon film formed on an insulation film becomes stable, and is dense and well crystallized and thus provides high quality, when having the (111) surface orientation in the direction perpendicular to the insulation film. In this embodiment, 1909 is a silicon oxide film layer of the present invention having the thickness of 0.2 μm and formed by the procedure similar to the one in the first embodiment by using the apparatus of FIG. 19, and is formed on the (111) oriented polysilicon at 400° C. with the thickness of 3 nm.

According to the present invention, there occurred no thinning of oxide film at the sharp corner part of the device isolation region formed between the transistors, and it was confirmed that the silicon oxide film is formed with uniform film thickness on the polysilicon in any of the flat part and edge part. The ion implantation process for forming the source and drain regions was conducted without passing through the gate oxide film, and the electrical activation was made at 400° C. As a result, the entire process can be conducted at a temperature of 400° C. or less, and it was possible to form a transistor on a glass substrate. The transistor had the mobility of approximately 300 $cm^2/Vsec$ or more for electrons and approximately 150 $cm^2/Vsec$ or more for holes. Further, a voltage of 12V or more was obtained for the source and drain breakdown voltages and for the gate breakdown voltage. A high-speed operation exceeding 100 MHz became possible in the transistor having the channel length of about 1.5–2.0 nm. The leakage characteristics of the silicon oxide film and the interface state characteristics of the polysilicon/oxide film were good.

By using the transistor of this embodiment, the liquid crystal display devices or organic EL photoemission devices can provide large display area, low cost, high-speed operation, and high reliability.

While this embodiment is the one in which the gate oxide film or the gate nitride film of the present invention is applied to a polysilicon, this embodiment is applicable also to the gate oxide film or gate nitride film of an amorphous silicon thin-film transistor (TFT), and particularly, a staggered-type thin-film transistor (TFT), which is used in a liquid crystal display device and the like.

(Ninth Embodiment)

Next, a description will be given of an embodiment of a three-dimensional stacked LSI in which an SOI device having a metal layer, a polysilicon device, and an amorphous silicon device are stacked.

Figure 21:
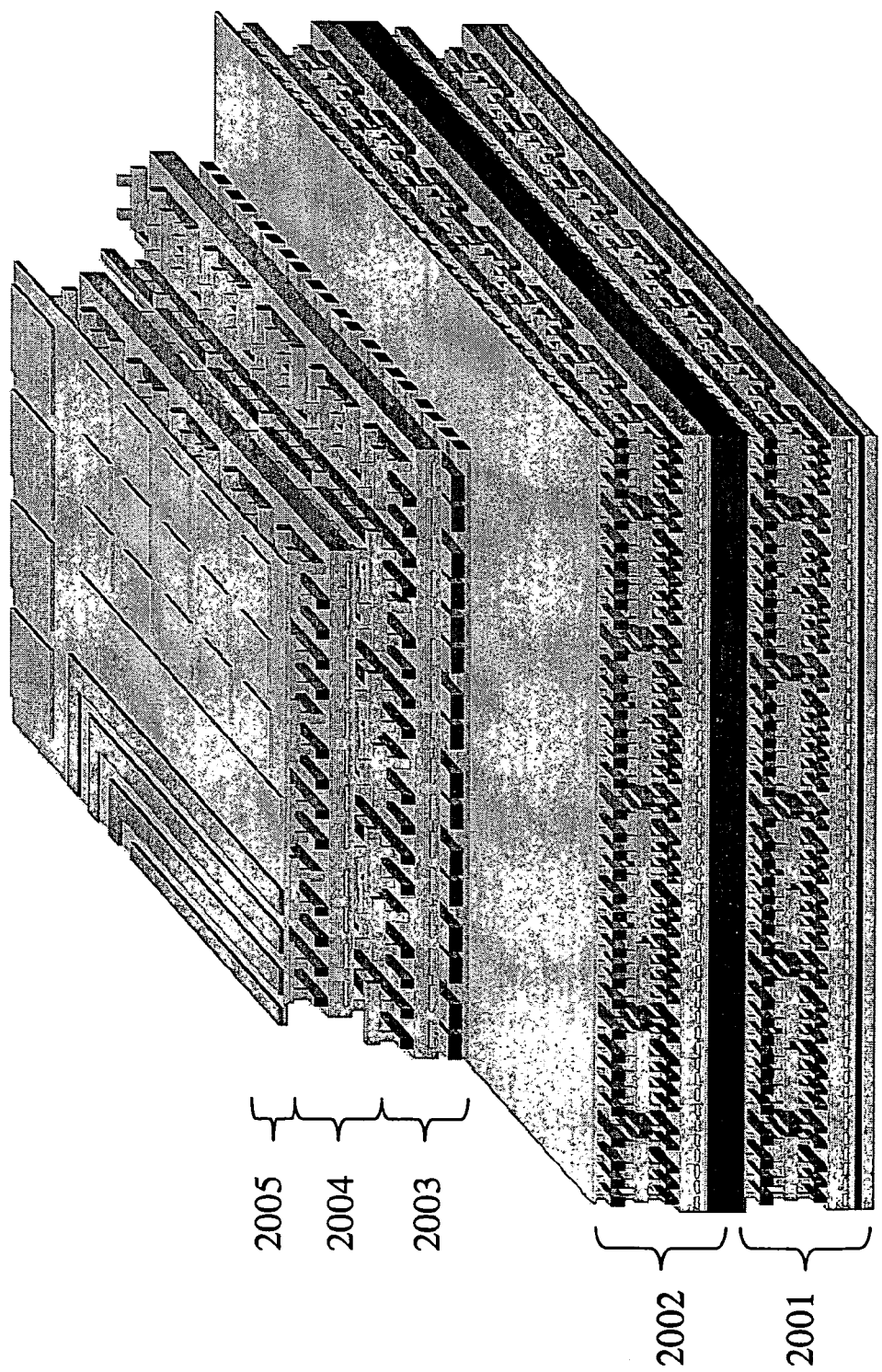
FIG. 21 is a conceptual diagram of a cross-sectional structure of a three-dimensional LSI.

FIG. 21 is a conceptual diagram of the cross-section structure of the three-dimensional LSI of the present invention.

Referring to FIG. 21, 2001 is a first SOI and wiring layer, 2002 is a second SOI and wiring layer, 2003 is a first polysilicon device and wiring layer, 2004 is a second polysilicon device and wiring layer, and 2005 is an amorphous semiconductor device, a functional-material device, and a wiring layer.

In the first SOI and wiring layer 2001 and also in the second SOI and wiring layer 2002, there are formed digital processing parts, high-precision and high-speed analog parts, synchronous DRAM parts, power supply parts, interface circuit parts, and the like, by using the SOI transistors explained in the seventh embodiment.

In the first polysilicon device and wiring layer 2003, there are formed parallel digital operation parts, inter-functional block repeater parts, memory device parts, and the like, by using the polysilicon transistors or flash memories explained in the sixth and eighth embodiments.

In the second polysilicon device and wiring layer 2004, there are formed parallel analog operation parts such as an amplifier, A/D converter, and the like, by using the polysilicon transistor explained in the eighth embodiment. Optical sensors, sound sensors, touch sensors, radio wave transceiver parts, and the like, are formed in the amorphous semiconductor device and functional-material device and wiring layer 2005.

The signals of the optical sensors, sound sensors, touch sensors, and radio wave transceiver parts that are provided in the amorphous semiconductor device and functional-material device and wiring layer 2005 are processed by the parallel analog operation part such as an amplifier or A/D converter provided in the second polysilicon device and wiring layer 2004 and using the polysilicon transistor, and are forwarded further to the parallel digital operation parts and the memory device parts provided in the first polysilicon device and wiring layer 2003 or the second polysilicon device and wiring layer 2004 and using the polysilicon transistors and flash memory devices. Further, the signals are processed by the digital processing parts, high-precision and high-speed analog parts, or the synchronous DRAM parts provided in the first SOI and wiring layer 2001 or second SOI and wiring layer 2002 and using the SOI transistors.

In addition, the inter-functional block repeater part provided in the first polysilicon device and wiring layer 2003 does not occupy a large chip area even when provided with plural numbers, and it is possible to adjust synchronization of signals all over the LSI.

It should be noted that production of such a three-dimensional LSI has become possible as a result of the technology of the present invention explained in detail in the above-described embodiments.

In the above, the description are given of the present invention with respect to the preferred embodiments. However, the present invention is not limited to such specific embodiments, and variations and modifications may be made without departing from the scope of the present invention.

INDUSTRIAL APPLICABILITY

According to the present invention, it becomes possible to completely remove surface-terminating hydrogen even at low temperature of about 400° C. or less in continuous processing without breaking vacuum and without degrading the planarity of a silicon surface. Hence, it is possible to form a silicon oxide film, silicon nitride film, and silicon oxynitride film, having characteristics and reliability superior to those of a silicon oxide film formed by a conventional thermal oxidation process or microwave plasma processing, on a silicon of any surface orientation at low temperature of about 500° C. or less. Consequently, it becomes possible to realize a miniaturized transistor integrated circuit having high reliability and high performance.

Also, according to the present invention, it becomes possible to form a thin and high-quality silicon oxide film, silicon nitride film, and silicon oxynitride film having good characteristics such as leakage current and breakdown voltage even on a silicon surface of a corner part of a device isolation sidewall of, for example, a shallow-trench isolation or on a silicon surface having a surface form with projections and depressions. Consequently, it becomes possible to achieve high-density device integration with a narrowed device isolation width and high-density device integration having a three-dimensional structure.

In addition, by using the gate insulation film of the present invention, it was possible to realize a flash memory device and the like capable of significantly increasing the number of times of rewriting.

Further, according to the present invention, it becomes possible to form a high-quality silicon gate oxide film and silicon gate nitride film even on a polysilicon formed on an insulation film and having a predominantly (111)-oriented surface. As a result, it becomes possible to realize a display apparatus that uses a polysilicon transistor having high driving ability, and further, a three-dimensional integrated circuit device in which a plurality of transistors and functional devices are stacked, which provides great technology spillover effects.

What is claimed is:

1. A semiconductor device comprising a silicon compound layer formed on a silicon surface,
    wherein said silicon compound layer contains at least a predetermined inert gas and has a hydrogen content of $10^{11}/cm^2$ or less in terms of surface density.

2. The semiconductor device as claimed in claim 1, wherein the inert gas is at least one kind of argon (Ar), krypton (Kr), and xenon (Xe).

3. A semiconductor memory device comprising, on a common substrate, a transistor including a polysilicon film formed on a silicon surface via a first silicon compound layer, and a capacitor including a second silicon compound layer formed on a polysilicon surface,
    wherein each of said first and second silicon compound layers contains at least a predetermined inert gas and has a hydrogen content of $10^{11}/cm^2$ or less in terms of surface density.

4. A semiconductor device having a polysilicon layer or amorphous silicon layer formed on a substrate as an active layer,
    wherein a silicon compound layer containing at least a predetermined inert gas and having a hydrogen content of $10^{11}/cm^2$ or less in terms of surface density is formed on a surface of said silicon layer, and
    said semiconductor device drives a display device formed on the substrate.

* * * * *

UNITED STATES PATENT AND TRADEMARK OFFICE
CERTIFICATE OF CORRECTION

PATENT NO. : 6,975,018 B2
DATED : December 13, 2005
INVENTOR(S) : Tadahiro Ohmi et al.

It is certified that error appears in the above-identified patent and that said Letters Patent is hereby corrected as shown below:

<u>Title page,</u>
Item [75], Inventors, "Yasuyuki1" should read -- Yasuyuki --.

Signed and Sealed this

Twenty-eighth Day of March, 2006

JON W. DUDAS
*Director of the United States Patent and Trademark Office*